United States Patent
Morimoto et al.

[11] Patent Number: 6,103,583
[45] Date of Patent: Aug. 15, 2000

[54] METHOD FOR PRODUCING QUANTIZATION FUNCTIONAL DEVICE

[75] Inventors: Kiyoshi Morimoto, Hirakata; Koichiro Yuki, Neyagawa; Yoshihiko Hirai, Osaka; Kiyoyuki Morita, Yawata, all of Japan

[73] Assignee: Matsushita Electric Industrial Co., Ltd., Osaka, Japan

[21] Appl. No.: 09/370,005

[22] Filed: Aug. 6, 1999

Related U.S. Application Data

[62] Division of application No. 08/757,578, Nov. 27, 1996, Pat. No. 5,945,687.

[30] Foreign Application Priority Data

Nov. 30, 1995 [JP] Japan ................................. 7-312015

[51] Int. Cl.⁷ .............................................. H01L 21/331
[52] U.S. Cl. .............................................. 438/312
[58] Field of Search .................................. 438/312, 311, 438/800; 257/25–27

[56] References Cited

U.S. PATENT DOCUMENTS

| | | |
|---|---|---|
| 3,121,177 | 2/1964 | Davis . |
| 3,171,762 | 3/1965 | Rutz . |
| 5,093,699 | 3/1992 | Weichold et al. . |
| 5,216,262 | 6/1993 | Tsu . |
| 5,234,848 | 8/1993 | Seabaugh . |
| 5,376,823 | 12/1994 | Kojima et al. . |
| 5,422,305 | 6/1995 | Seabaugh et al. . |
| 5,444,267 | 8/1995 | Okada et al. . |
| 5,486,706 | 1/1996 | Yuki et al. . |
| 5,514,614 | 5/1996 | Yuki et al. . |
| 5,562,802 | 10/1996 | Okada et al. . |
| 5,723,872 | 3/1998 | Seabaugh et al. ............ 257/25 |
| 5,739,544 | 4/1998 | Yuki et al. ................... 257/25 |

FOREIGN PATENT DOCUMENTS

| | | |
|---|---|---|
| 56-2625 | 1/1981 | Japan . |
| 5-55547 | 3/1993 | Japan . |
| 5-235378 | 9/1993 | Japan . |
| 8-46222 | 2/1996 | Japan . |

OTHER PUBLICATIONS

R. Esaki et al., "Tunnel Effect and the Devices Relating the Same", *Superlattice Hetero Structure Device*, pp. 397–435 (Sep. 1988).

R. Esaki et al., "Molecular Beam Epitaxy (MBE)", *Superlattice Hetero Structure Device*, pp. 197–252 (1988).

K. Ismail et al., "Electron Resonant Tunneling in Si/SiGe Double Barrier Diodes", *Appl. Phys. Lett. 59(8)*, pp. 973–975.

M. Hirose et al., "Resonant Tunneling Through $Si/SiO_2$ Double Barriers", *Japanese Journal of Applied Physics*, vol. 16, pp. 561–564 (1977).

J.C. Hensel, et al., "Transistor Action in $Si/CoSi_2/Si$ Heterostructures", *Appl. Phys. Lett.*, vol. 47(2), pp. 151–153 (Jul. 1985).

K. Saki et al., "Resonant Tunneling Through $SiO_2/Si/SiO_2$ Double Barriers", *Extended Abstracts (The 52nd Autumn Meeting, 1991): The Japan Society of Applied Physics*, No. 2, p. 653, 10a–B–3.

IBM Technical Disclosure Bulletin, vol. 34, No. 4A Sep. 1991, pp. 251–252.

*Primary Examiner*—Charles Bowers
*Assistant Examiner*—Craig Thompson
*Attorney, Agent, or Firm*—Ratner & Prestia

[57] ABSTRACT

A quantization functional device includes: a silicon thin layer having a first surface and a second surface each made of a predetermined crystal surface, and the silicon thin layer being formed of single crystalline silicon having a thickness sufficiently thin to function as a quantum well; a pair of tunnel barriers respectively provided on the first and second surfaces of the silicon thin layer; and a first electrode and a second electrode operatively coupled to each other and formed so as to interpose the silicon thin layer and the pair of the tunnel barriers therebetween.

21 Claims, 41 Drawing Sheets

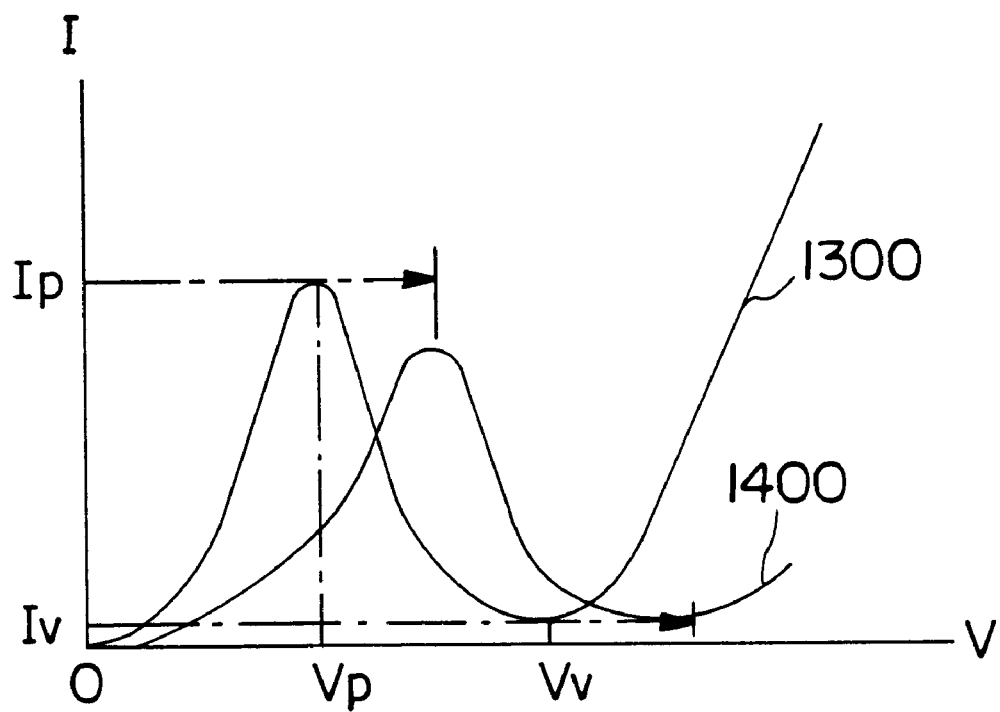
F I G. 20

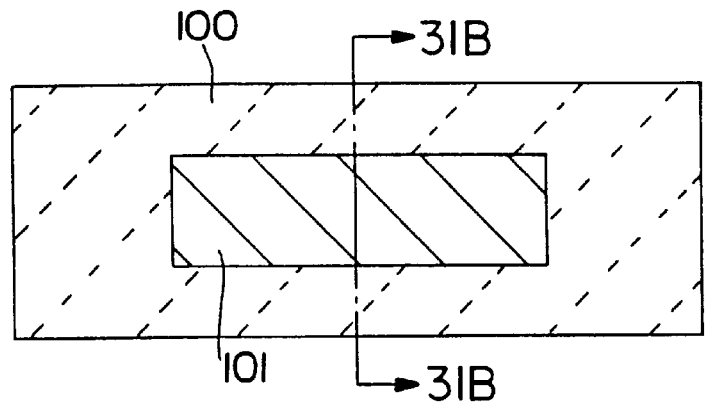
FIG. 31A
FIG. 31B
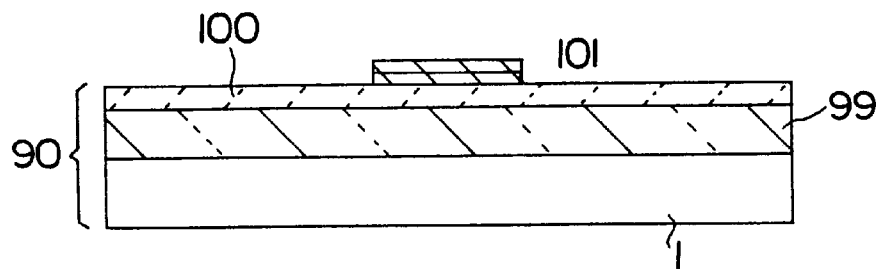
FIG. 31C
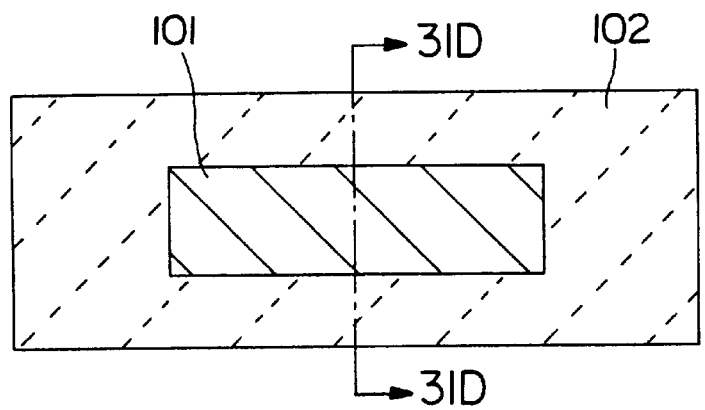
FIG. 31D
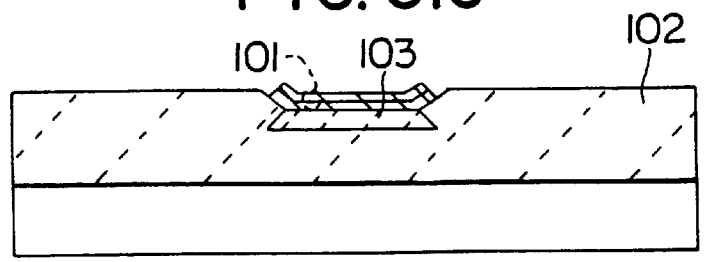

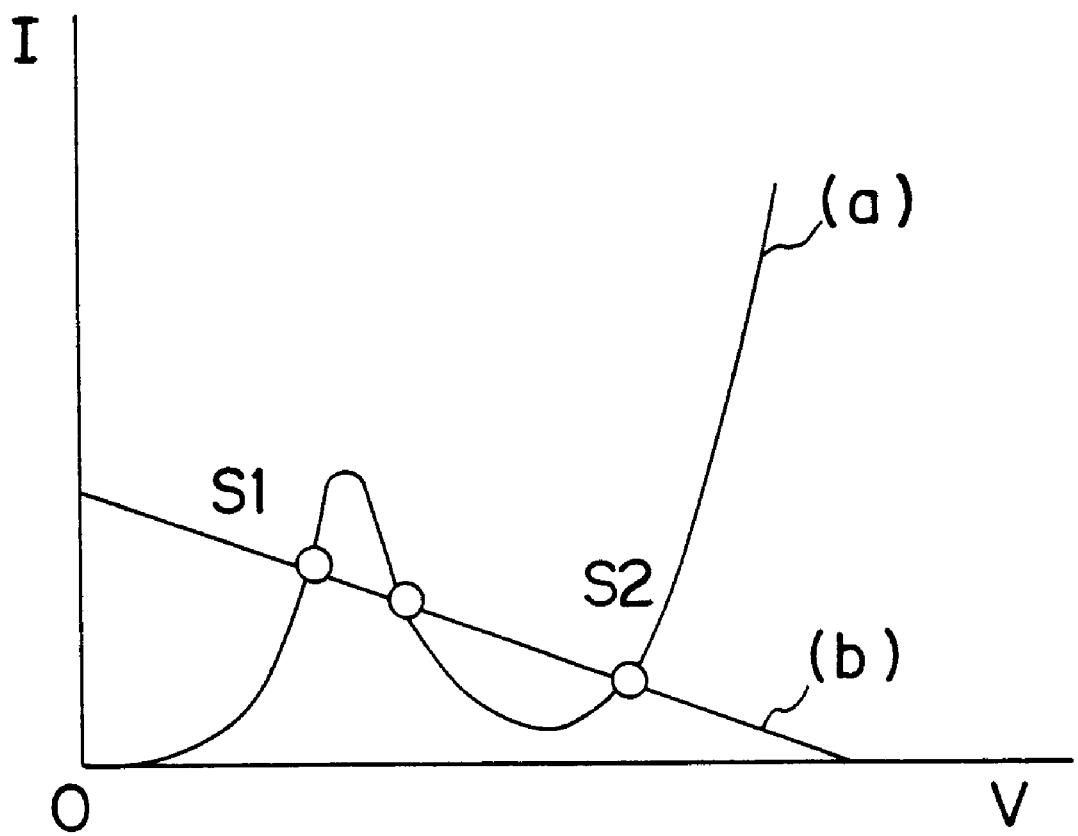
F I G. 37

METHOD FOR PRODUCING QUANTIZATION FUNCTIONAL DEVICE

This application is a division of U.S. patent application No. 08/757,578 filed Nov. 27, 1996 now U.S. Pat. No. 5,945,687.

BACKGROUND OF THE INVENTION

1. Field of the Invention

The present invention relates to a quantization functional device utilizing a resonance tunnel effect, a quantization functional apparatus using the same, and a method for producing the same. In particular, the present invention relates to a resonance tunnel diode, a memory using the same, and a method for producing the same.

2. Description of the Related Art

Recently, quantization functional devices utilizing a quantum effect have been actively studied. As practically usable quantization functional devices, devices which utilize a resonance tunnel effect of electrons such as resonance tunnel diodes have been proposed. A resonance tunnel diode needs a double-barrier structure, in which a quantum well having a size close to that of the de Broglie wavelength of electrons is interposed between tunneling barriers. In particular, a resonance tunnel diode which utilizes a heterojunction formed in compound semiconductor materials has been proposed.

In general, such a resonance tunnel diode is produced by sequentially forming compound semiconductor thin films on a compound semiconductor substrate using crystal growth, wherein each thin film has a thickness corresponding to several atoms. See, for example, Reona Ezaki and Hiroyuki Sakaki, *Superlattice Hetero Structure Device*, Kogyo Chosakai, pp. 197–252 and pp. 397–435 (1988).

Compound semiconductor materials are typically deposited by molecular beam epitaxy (MBE). One exemplary method for producing a conventional resonance tunnel diode using compound semiconductor materials will be described with reference to FIGS. 40A through 40D. In this specification, all the numerical figures representing thicknesses, concentrations, etc. are given as approximate values.

First, as shown in FIG. 40A, on a first Si-doped GaAs layer 11, a first AlGaAs layer 12 is grown to a thickness of about 2.3 nm. Next, a GaAs layer 13 having a thickness of about 7 nm (FIG. 40B), a second AlGaAs layer 14 having a thickness of about 2.3 nm (FIG. 40C), and a second Si-doped GaAs layer 15 (FIG. 40D) are sequentially formed on the first AlGaAs layer 12. In this manner, a resonance tunnel diode having a double-barrier structure of the first AlGaAs layer 12/GaAs layer 13/second AlGaAs layer 14 is produced.

On the other hand, as a double-barrier structure formed of silicon materials, a structure including a silicon substrate, and a silicon oxide layer and a polycrystalline silicon layer formed on the silicon substrate has been proposed. See, for example, Kazuo Saki et al., Extended abstracts (The 52nd Autumn Meeting, 1991), The Japan Society of Applied Physics, No. 2, page 653, 10a-B-3, entitled "Resonance Tunnel Effect in the $SiO_2/Si/SiO_2$ Double-Barrier Structure".

With reference to FIGS. 41A through 41E, a method for producing a conventional resonance tunnel diode formed of silicon materials will be described.

First, an n-type silicon substrate 21 (FIG. 41A) is treated with dry oxidation performed at a temperature of about 1000° C. to form a first silicon oxide layer 22 having a thickness of about 3 nm to about 4 nm (FIG. 41B). Next, a polycrystalline silicon layer 23 having a thickness in a range between about 8 nm to about 12 nm is formed on the first silicon oxide layer 22 (FIG. 41C). The resultant body is treated with dry oxidation performed at a temperature of about 1000° C. to form a second silicon oxide layer 24 having a thickness of about 3 nm to about 4 nm (FIG. 41D). Thus, a double-barrier structure is formed. Then, aluminum is deposited in a vacuum on the second silicon oxide layer 24 to form an aluminum electrode 25 (FIG. 41E). In this manner, a resonance tunnel diode having a double-barrier structure of the first silicon oxide layer 22/polycrystalline silicon layer 23/second silicon oxide layer 24 is produced.

The above-described conventional resonance tunnel diodes have the following problems.

(1) In a resonance tunnel diode formed of compound semiconductor materials, the height of the tunneling barrier is as low as about 1.5 eV or less, and thus electrons cannot be confined in a quantum well sufficiently. Due to the insufficient confinement of the electrons, some electrons transmit through the double-barrier structure even when the electron energy is not in a resonant state in the quantum well. Accordingly, the P/V (peak current/valley current) ratio in the I–V characteristic of the resonance tunnel diode cannot be made sufficiently large. The valley current refers to the minimum current in the I–V characteristic.

(2) In a resonance tunnel diode formed of silicon materials, the quantum well tends to have a relatively poor crystallinity. Therefore, the quantum level in the quantum well is not sufficiently sharp (i.e., the energy level broadens to a certain extent), and thus a satisfactory negative resistance characteristic cannot be obtained.

SUMMARY OF THE INVENTION

The quantization functional device of this invention includes a silicon thin layer having a first surface and a second surface each made of a predetermined crystal surface. The silicon thin layer is formed of single crystalline silicon having a thickness sufficiently thin to function as a quantum well. A pair of tunnel barriers are respectively provided on the first and second surfaces of the silicon thin layer; and a first electrode and a second electrode are operatively coupled to each other and are formed so as to interpose the silicon thin layer and the pair of the tunnel barriers therebetween.

The present invention further provides a quantization functional apparatus which utilizes the quantization functional device having the above configuration.

The method for fabricating the quantization functional device of this invention includes the steps of: forming a silicon island on a silicon-on-insulator substrate including a silicon substrate, a buried insulating layer and an upper silicon layer; forming a silicon thin layer having a first surface and a second surface and having a thickness sufficiently thin to function as a quantum well; forming a pair of tunnel barriers respectively on the first and second surfaces of the silicon thin layer; and forming a first electrode and a second electrode operatively coupled to each other and interposing the silicon thin layer and the pair of tunnel barriers therebetween.

The present invention further provides a method for fabricating a quantization functional apparatus which utilizes the method for fabricating the quantization functional device described above.

In a quantization functional device according to the present invention, a silicon thin layer formed in a silicon substrate functions as a quantum well which provides a quantum effect. By further providing a pair of tunneling barriers interposing the quantum well as well as a pair of electrodes, a structure functioning as a resonance tunnel diode is provided.

A quantization functional device according to the present invention is formed of silicon type materials, and basically, fabricated in the same process, e.g., a thermal oxidation, as used for the fabrication of CMOS devices. Thus, it is possible to simultaneously provide a quantization functional device and other semiconductor devices such as MOS-type transistors on the same substrate in a series of fabrication process steps.

Thus, the invention described herein makes possible the advantages of: (1) providing a quantization functional device utilizing a resonance tunnel effect, specifically a resonance tunnel diode, which has a double-barrier structure including a quantum well structure having a sufficiently high tunneling barrier and a satisfactory crystallinity and thus can be produced by a conventional method for producing semiconductor devices and which also exhibits satisfactory operational characteristics; (2) providing a quantization functional apparatus utilizing the same, specifically a memory; and (3) providing a method for producing the same.

These and other advantages of the present invention will become apparent to those skilled in the art upon reading and understanding the following detailed description with reference to the accompanying figures.

BRIEF DESCRIPTION OF THE DRAWINGS

FIG. 20 is a graph illustrating the I–V characteristics of the resonance tunnel diode shown in FIG. 16A;

FIGS. 31A, 31C, 32A, 32C, 33A and 33C are top views illustrating a method for producing the resonance tunnel diode shown in FIG. 30A;

FIGS. 31B, 31D, 32B, 32D, 33B and 33D are cross sectional views taken along lines X–X' in FIGS. 31A, 31C, 32A, 32C, 33A and 33C, respectively;

FIG. 37 is a graph illustrating the I–V characteristics of the memory shown in FIG. 36A;

DESCRIPTION OF THE PREFERRED EMBODIMENTS

Hereinafter, the present invention will be described by way of illustrative examples with reference to the accompanying drawings.

EXAMPLE 1

A resonance tunnel diode 10 in a first example according to the present invention will be described with reference to FIGS. 1A through 5.

Figure 1A:
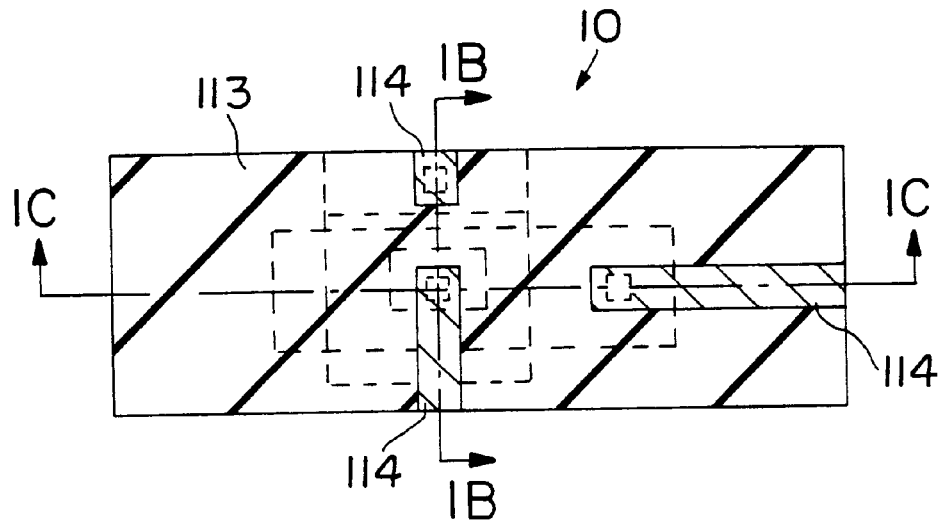
FIG. 1A is a top view of the resonance tunnel diode in a first example according to the present invention.
Figure 1B:
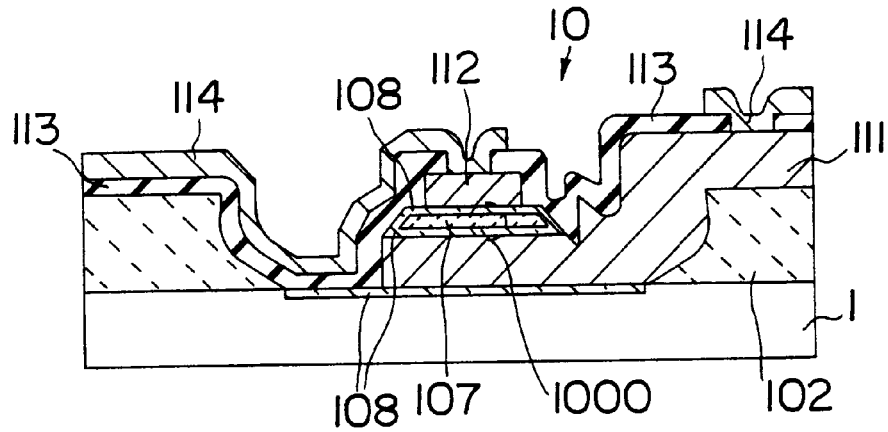
FIG. 1B is a cross sectional view of the resonance tunnel diode shown in FIG. 1A taken along line 1B—1B in FIG. 1A.
Figure 1C:
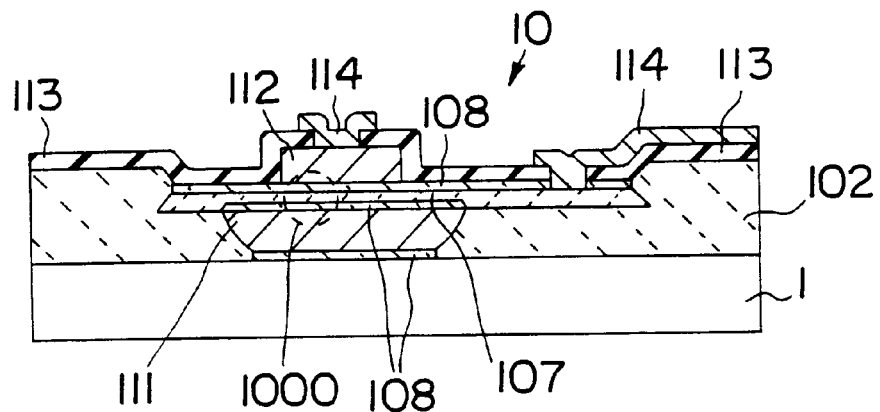
FIG. 1C is a cross sectional view of the resonance tunnel diode shown in FIG. 1A taken along line 1C—1C in FIG. 1A.

FIG. 1A is a top view of the resonance tunnel diode 10 in the first example, FIG. 1B is a cross sectional view of the resonance tunnel diode 10 taken along line 1B—1B in FIG. 1A, and FIG. 1C is a cross sectional view of the resonance tunnel diode 10 taken along line 1C—1C in FIG. 1A. FIGS. 2A through 2D, 3A through 3D, and 4A through 4D illustrate a method for producing the resonance tunnel diode 10. FIGS. 2A, 2C, 3A, 3C, 4A and 4C are top views, and FIGS. 2B, 2D, 3B, 3D, 4B and 4D are cross sectional views taken along lines X–X' in FIGS. 2A, 2C, 3A, 3C, 4A and 4C, respectively.

As shown in FIGS. 1B and 1C, the resonance tunnel diode 10 includes a silicon substrate 1, a field oxide layer 102, and a silicon thin layer 107 held by the field oxide layer 102 at both ends thereof (FIG. 1C). The silicon thin layer 107 is formed of single crystalline silicon and has a thickness of about 0.3 nm to about 100 nm, preferably, from several nanometers to about 50 nm, and further specifically, about 10 nm, so that a quantum size effect is obtained in the silicon thin layer 107 to allow the silicon thin layer 107 to act as a quantum well. The aforementioned lower limit corresponds to a thickness of one atomic layer. At least a part of the silicon thin layer 107 directly below a second electrode 112 (described later) has a uniform thickness. The field oxide layer 102 does not exist at least partially below the silicon thin layer 107 as a result of being etched away by an etchant including hydrogen fluoride acid. Thus, the silicon thin layer 107 is partially in a free-standing state so that the both ends thereof are supported, for example, by the field oxide layer 102.

On top and bottom surfaces of the silicon thin layer 107, silicon oxide layers 108 each having a uniform thickness of about 5 nm or less, preferably about 1.5 nm are provided. The silicon oxide layers 108 each act as a tunneling barrier.

A first electrode 111 and a second electrode 112 are provided in contact with the silicon oxide layers 108, respectively. The first and second electrodes 111 and 112 are both formed of polycrystalline silicon containing n-type impurities at a sufficiently high concentration. As the n-type impurities, phosphorus or arsenic can be used, which are generally used in the field of semiconductor processing. Third electrodes 114 are further provided for controlling voltages to be applied to the first and second electrodes 111 and 112 or for controlling the potential of the silicon thin layer (the quantum well) 107. An inter-level insulation layer 113 is provided between the first and second electrodes 111 and 112, and the third electrodes 114.

In the drawings, the first electrode 111 is larger than the second electrode 112, but the second electrode 112 can be larger than the first electrode 111. Alternatively, the first and second electrodes 111 and 112 can be the same size.

In the resonance tunnel diode 10 having the above-described structure, the silicon thin layer 107, acting as a quantum well, and the silicon oxide layers 108 provided on the silicon thin layer 107, each acting as a tunneling barrier, form a double-barrier structure 1000 for generating a resonance effect. The double-barrier structure 1000 and the first and second electrodes 111 and 112 sandwiching the double-barrier structure 1000 form an essential part of the resonance tunnel diode 10.

With reference to FIGS. 2A through 2D, 3A through 3D, and 4A through 4D, a method for producing the resonance tunnel diode 10 will be described.

Figure 2A:
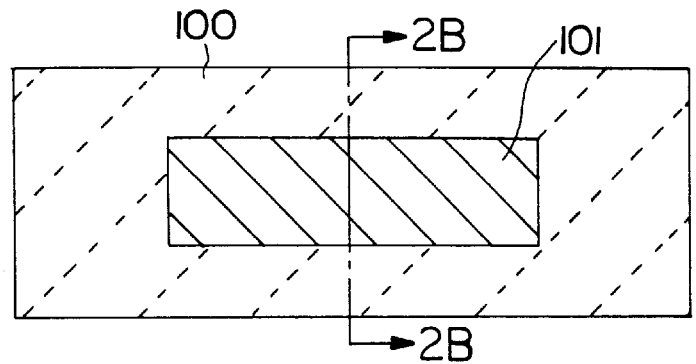
FIGS. 2A, 2C, 3A, 3C, 4A and 4C are top views illustrating a method for producing the resonance tunnel diode shown in FIG. 1A.
Figure 2B:
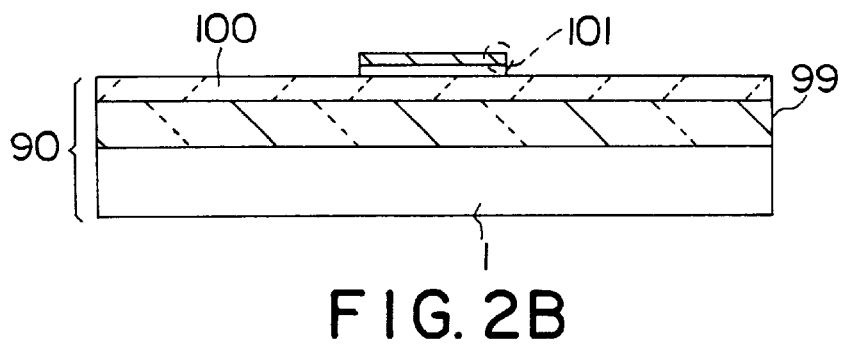
FIGS. 2B, 2D, 3B, 3D, 4B and 4D are cross sectional views taken along lines 2B—2B, 2D—2D, 3B—3B, 3D—3D, 4B–4B,and 4D—4D, respectively, in FIGS. 2A, 2C, 3A, 3C, 4A and 4C, respectively.

As shown in FIGS. 2A and 2B, a silicon-on-insulator (SOI) substrate 90 is formed of the n-type silicon substrate 1 having a (001) surface orientation, a buried silicon oxide layer 99 having a thickness of about 400 nm, and a silicon layer 100 having a thickness of about 100 nm layered sequentially in that order. A multi-film layer 101 including a pad oxide film and a nitride film is formed on the SOI substrate 90. The pad oxide film is formed to a thickness of about 50 nm by pyrogenic oxidation performed at a temperature of about 900° C. for about 26 minutes, and the nitride film is formed to a thickness of about 120 nm by low pressure chemical vapor deposition (LPCVD).

Then, the multi-film layer 101 is patterned into a rectangle having a size of about 3 μm×about 10 μm by photolithography and dry etching using $O_2$ gas and $CF_4$ gas.

Figure 2C:
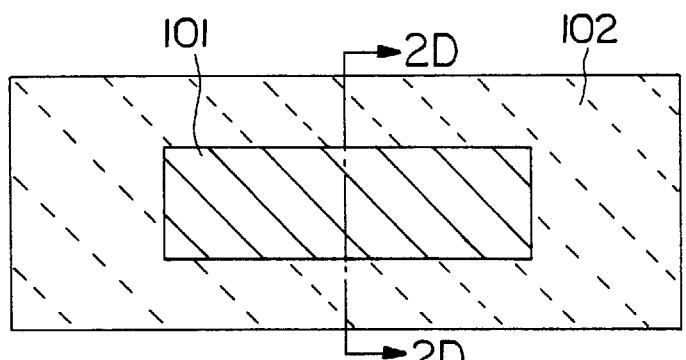
Figure 2D:
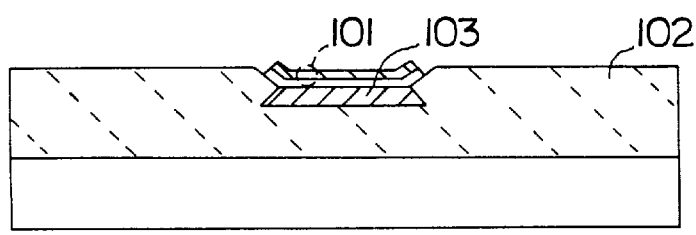

The resultant body is treated with pyrogenic oxidation performed at a temperature of about 1000° C. for about an hour to perform separation by local oxidation of silicon (LOCOS separation). Specifically, the silicon layer 100 is completely oxidized by the pyrogenic oxidation except for the area covered with the multi-film layer 101, and the oxidized area of the silicon layer 100 is coupled with the buried silicon oxide layer 99 to form the field oxide layer 102 as shown in FIGS. 2C and 2D. As a result, a silicon island 103 completely isolated from another silicon island in the adjacent device by the field oxide layer 102 is formed. The silicon island 103 has a thickness of about 77 nm.

The nitride film is etched by hot phosphoric acid at a temperature of about 160° C. for about 80 minutes, and the pad oxide film is etched by 2% buffered hydrogen fluoride acid at a temperature of about 25° C. for about 4 minutes. Thus, the multi-film layer 101 is removed.

Figure 3A:
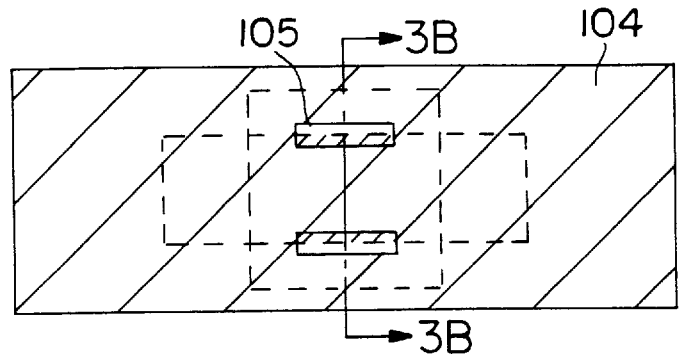
Figure 3B:
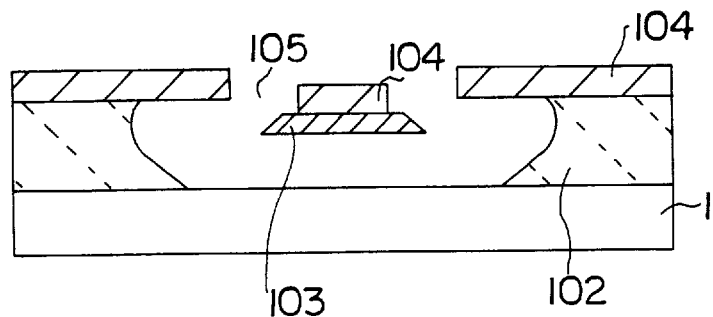

As shown in FIG. 3A, a first resist layer 104 is formed on the field oxide layer 102 and patterned to have openings 105 of 0.5 μm×1 μm using a mask pattern. The resultant body is treated by etching performed by 20% buffered hydrogen fluoride acid for about 10 minutes to remove a part of the field oxide layer 102 directly below the silicon island 103. Thus, as shown in FIG. 3B, the silicon island 103 is partially in a free-standing state.

Then, after the first resist layer 104 is removed, the resultant body is treated with pyrogenic oxidation performed at a temperature of about 1000° C., which is above the threshold temperature for silicon oxide to flow in a viscous state (about 965° C.) to form a silicon oxide layer having a thickness of about 76 nm (not shown). Then, the silicon oxide layer is removed by etching using 5% buffered hydrogen fluoride acid. By such etching, the thickness of the free-standing part of the silicon island 103 is reduced, and the silicon thin layer 107 (thickness: about 7 nm) which is to act as a quantum well later is formed (FIG. 3D).

In the edge portions of the silicon island 103 generated by the LOCOS separation, stress is concentrated. According to the conventional method, since the silicon island 103 is treated by oxidation at a temperature of about 900° or less, the resultant silicon oxide layer formed on the edge portions is excessively thin because oxidation is not performed sufficiently. According to the present invention, the silicon island 103 is treated by oxidation at a temperature above about 965° C. Due to such a high oxidation temperature, a silicon oxide layer having a sufficient thickness is formed on the edge portions so that an electric leak is prevented from occurring between the electrode and the silicon thin layer 107 after the subsequent step of forming a tunneling barrier.

After the silicon thin layer 107 is formed, the resultant body is treated by dry oxidation performed at a temperature of about 700° C. for about 10 minutes to form silicon oxide layers 108 each having a thickness of about 1.5 nm so as to sandwich the silicon thin layer 107. The thickness of the silicon thin layer 107 becomes about 5 nm. The silicon oxide layers 108 formed in this manner each act as a tunneling barrier. Another silicon oxide layer 108 is formed on the silicon substrate 1 in this oxidation step.

Figure 3C:
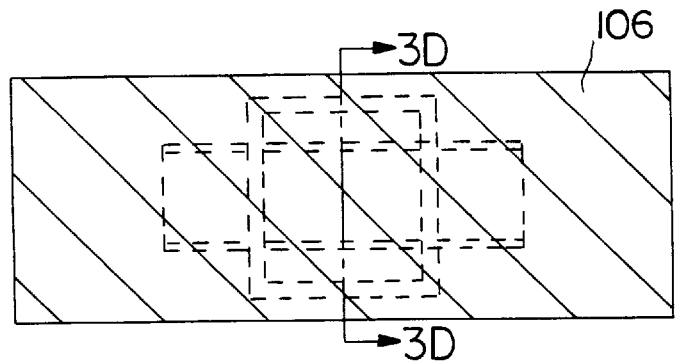
Figure 3D:
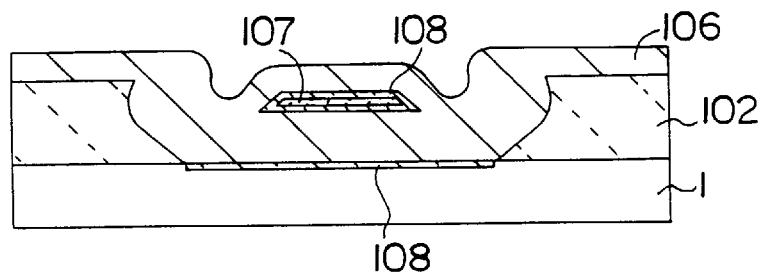

Then, a polycrystalline silicon layer 106 is formed by LPCVD to a thickness of about 300 nm (FIGS. 3C and 3D). The silicon thin layer 107 sandwiched by the silicon oxide layers 108 is covered with the polycrystalline silicon layer 106 in a satisfactory manner due to good step coverage of the deposition process, and thus the silicon thin layer 107 sandwiched by the silicon oxide layers 108 is completely enclosed by the polycrystalline silicon layer 106.

Next, the polycrystalline silicon layer 106 is doped with phosphorus by high concentration phosphorus diffusion performed at a temperature of about 900° C. for about 20 minutes using $POCl_3$ gas. Specifically, the polycrystalline silicon layer 106 is doped with phosphorus at a concentration of about $1 \times 10^{19}$ cm$^{-3}$ or more.

Figure 4A:
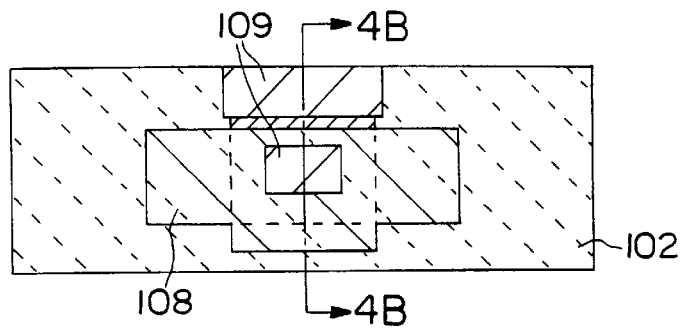
Figure 4B:
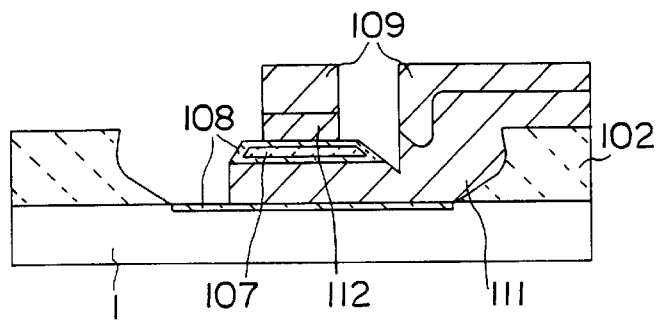

Then, as shown in FIG. 4A, a second resist layer 109 is formed on the polycrystalline silicon layer 106 by photolithography and patterning, and the resultant body is treated by dry etching using $SiCl_4$, $CH_2F_2$, $SF_6$ and $O_2$ gases. Thus, the first electrode 111 having a size of about 1 μm×about 1 μm and the second electrode 112 are formed as shown in FIG. 4B.

Figure 4C:
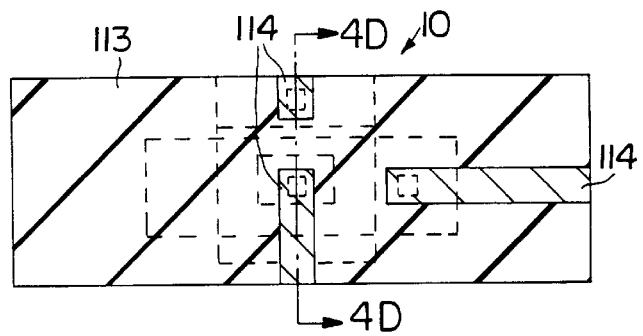
Figure 4D:
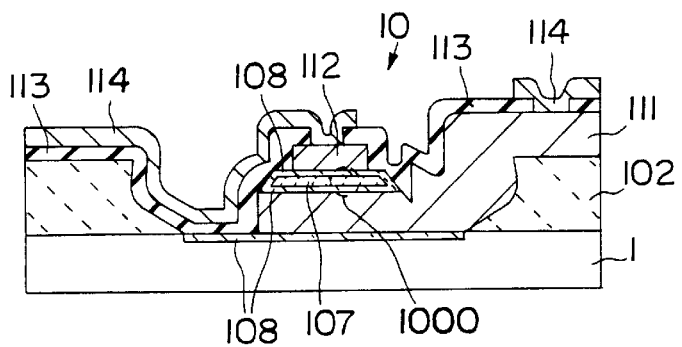

The second resist layer 109 is then removed. As shown in FIGS. 4C and 4D, the inter-level insulation layer 113 is formed on the resultant layer by LPCVD to a thickness of about 200 nm. A mask pattern having openings in positional correspondence with the first and second electrodes 111 and 112 is formed on the inter-level insulation layer 113 by photolithography. Then, the inter-level insulation layer 113 is etched by $CF_4$ gas and $O_2$ gas in accordance with the openings. Next, an aluminum layer is formed by sputtering to a thickness of about 1 μm and then patterned to form the third electrodes 114.

Thus, the resonance tunnel diode 10 is produced. The resonance tunnel diode 10 has the double-barrier structure 1000 of tunneling barrier (silicon oxide layer 108)/quantum well (silicon thin layer 107)/tunneling barrier (silicon oxide layer 108). The resonance tunnel diode 10 further includes the first and second electrodes 111 and 112, and the third electrodes 114 for controlling the potential of the quantum well.

In the resonance tunnel diode 10 of the first example, the silicon thin layer 107 acting as a quantum well is formed as a part of the silicon layer 100 which is the top layer of the SOI substrate 90. Accordingly, the crystallinity of the silicon thin layer 107 is as high as the silicon substrate. Since the silicon oxide layers 108 are each formed of a high quality oxide layer obtained by thermal oxidation, the potential barrier for electrons is as high as about 3.1 eV. Furthermore, the interface between the silicon layer and silicon oxide layer of the double-barrier structure 1000 is flat so that unevenness of the interface is negligible even at the atomic level. Accordingly, an extremely sharp quantization level of electronic energy is formed in the silicon thin layer 107, and thus a satisfactory resonance tunnel effect of electrons can be obtained. Moreover, since silicon, which is suitable for mass production and less costly, is used, the resonance tunnel diode 10 can be mass-produced with satisfactory performance at a reasonable cost.

The silicon oxide layers 108, each acting as the tunneling barrier, may be formed via CVD or ozone oxidation instead of thermal oxidation. Each tunneling barrier may be a nitride layer formed by thermal nitrification in a nitride atmosphere or by CVD, a nitrogen oxide layer, or an SiGe, $CaF_2$ or SiC layer formed by crystal growth.

The silicon substrate 1 may have any surface orientation which can form an SOI substrate, as well as the (001) surface orientation.

The silicon layer 100 may be of a p-type conductivity, in which case, the first and second electrodes 111 and 112 are formed of polycrystalline silicon containing p-type impurities diffused therein.

The third electrodes 114 may be formed of another type of metal instead of aluminum.

Instead of forming a silicon island 103 which is completely isolated by partially oxidizing the silicon layer 100, the silicon island 103 may be isolated by performing dry etching of the silicon layer 100 using the multi-film layer 101 including the pad oxide layer/nitride layer as a mask. In such a case, the silicon island is mesa-shaped.

Hereinafter, the resonance tunnel diode 10 in the first example and the conventional resonance tunnel diode will be compared with each other regarding the I–V device characteristic.

Figure 5:
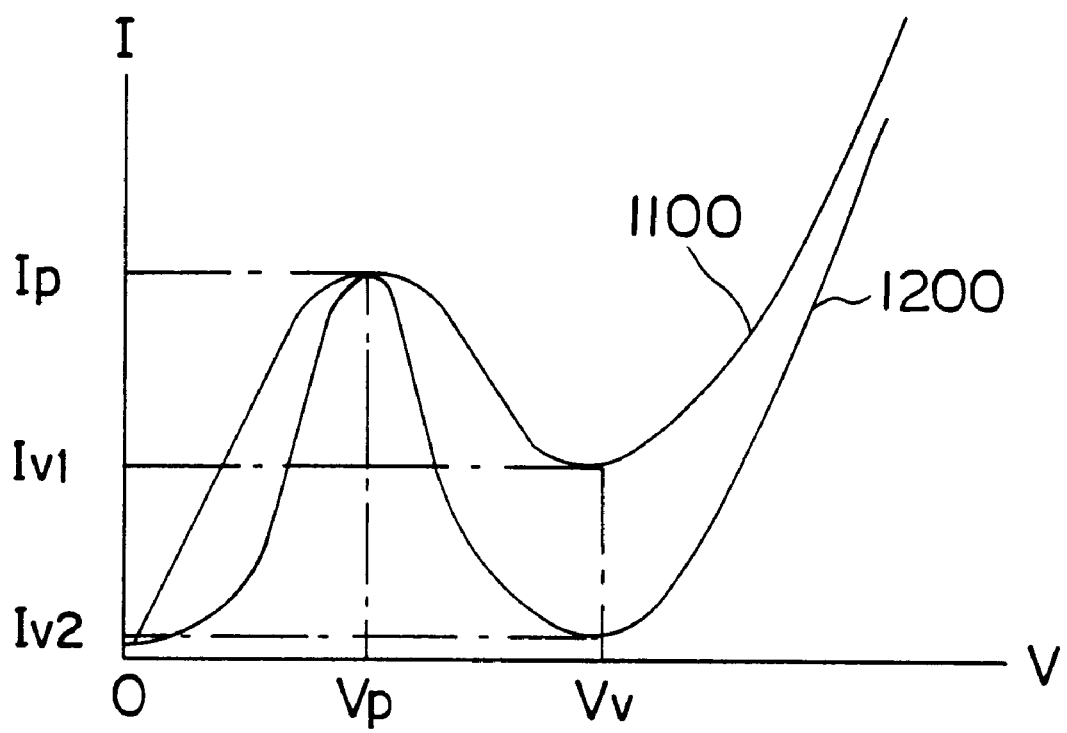
FIG. 5 is a graph illustrating the I–V characteristics of the resonance tunnel diode shown in FIG. 1A and a conventional resonance tunnel diode.

In FIG. 5, curve 1200 represents the I–V characteristic of the resonance tunnel diode 10, and curve 1100 represents that of the conventional resonance tunnel diode. Curves 1200 and 1100 are obtained by measuring the current flowing when a voltage is applied between, for example, the first and second electrodes 111 and 112. In FIG. 5, the peak current Ip is obtained when the quantization level in the silicon thin layer 107 acting as the quantum well is equal to the Fermi level of electrons in the first and second electrodes 111 and 112. When a voltage exceeding the voltage Vp, which gives the current Ip, is applied to the resonance tunnel diode, the negative resistance characteristic can be observed; i.e., the current is decreased as the applied voltage is increased. In FIG. 5, symbol "Iv" represents the valley current which is the minimum current in the I–V characteristic.

When the resonance tunnel diode 10 and the conventional resonance tunnel diode have the same quantum well width and the same thickness of the silicon oxide layer acting as the potential barrier, the peak current Ip and the valley current Iv are obtained at the same voltages (Vp and Vv). In the resonance tunnel diode 10, in which the silicon thin layer 107 is formed of single crystalline silicon, the quantization level is sharp, and thus valley current can be restricted to a much lower level than in the conventional resonance tunnel diode. As a result, the peak/valley ratio (Ip/Iv), which is an index of the performance of the resonance tunnel diode, is satisfactorily high in the resonance tunnel diode 10.

In the case where the first and second electrodes 111 and 112 are formed of polycrystalline silicon containing phosphorus at a concentration of as high as about $1 \times 10^{19}$ $cm^{-3}$, and each of the two tunneling barriers 108 of the double-barrier structure 1000 is formed of an oxide film which has a height of about 3.1 eV and a thickness of about 1.5 nm, and further the quantum well 107 of the double-barrier structure 1000 is formed of n-type single crystalline silicon and has a thickness of about 5 nm, the peak current density and the peak/valley ratio are both satisfactory. Specifically, the peak current density Jp is about 20 $A/cm^2$ around the applied voltage of about 0.5 V, and the peak/valley ratio is about 120 (electrode surface area: about 1 $\mu m \times$ about 1 $\mu m$; Ip=about 0.2 $\mu A$; Iv=about 1.7 nA).

In a silicon oxide/silicon/silicon oxide double-barrier structure, the I–V characteristic significantly varies in accordance with the thickness of the silicon oxide layer acting as the tunneling barrier and the width of the quantum well. In the above-mentioned example, if the n-type single crystalline silicon thin layer acting as the quantum well has a thickness of about 10 nm instead of about 5 nm, the peak current density around the applied voltage of about 0.5 V becomes about 13 $A/cm^2$ and the peak/valley ratio becomes about 4, which are significantly different from the values mentioned above. Accordingly, the thickness of the silicon thin layer 107 acting as the quantum well needs to be controlled extremely precisely. In the first example according to the present invention, the thickness of the silicon island 103 is reduced to form the silicon thin layer 107 by thermal oxidation. In this manner, the thickness can be relatively easily controlled on the order of 0.1 nm.

EXAMPLE 2

A resonance tunnel diode 20 in a second example according to the present invention will be described with reference to FIGS. 6A through 10B.

Figure 6A:
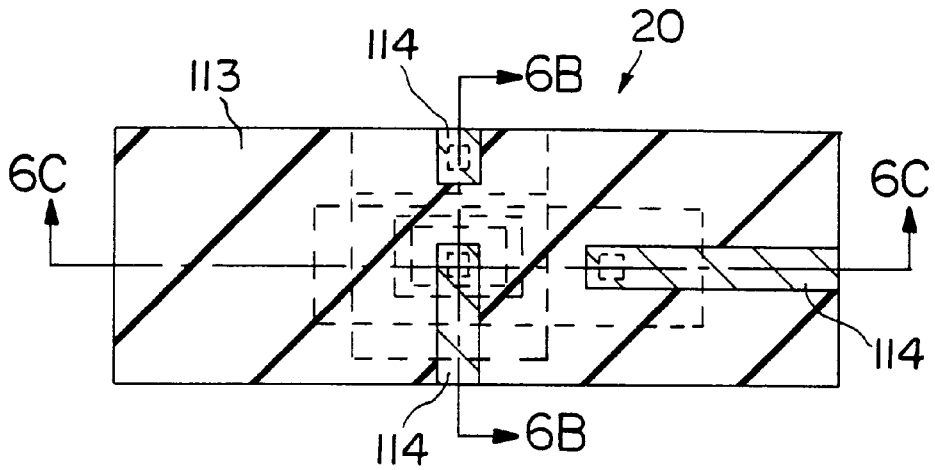
FIG. 6A is a top view of a resonance tunnel diode in a second example according to the present invention.
Figure 6B:
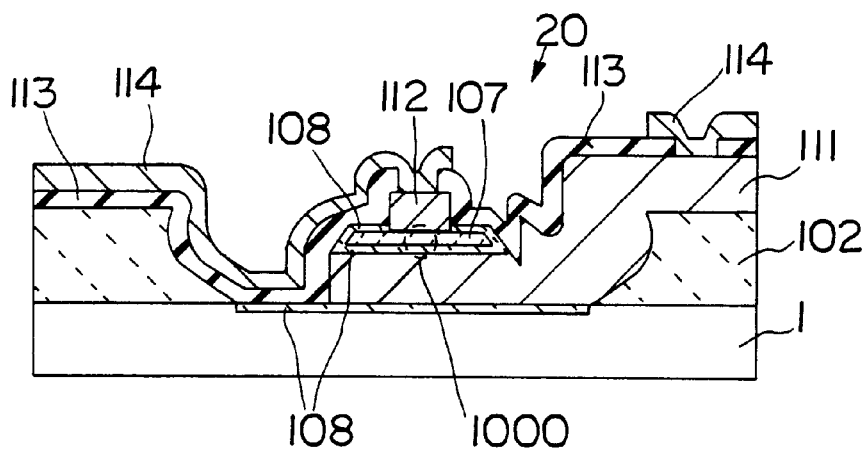
FIG. 6B is a cross sectional view of the resonance tunnel diode shown in FIG. 6A taken along line 6B—6B in FIG. 6A.
Figure 6C:
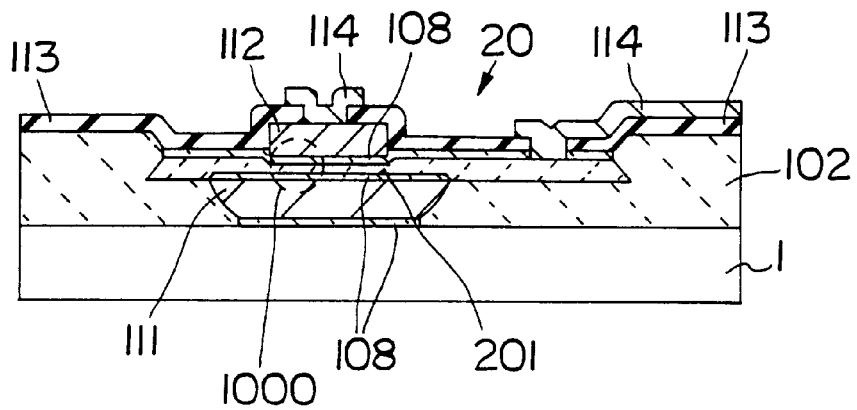
FIG. 6C is a cross sectional view of the resonance tunnel diode shown in FIG. 6A taken along line 6C—6C in FIG. 6A.

FIG. 6A is a top view of the resonance tunnel diode 20 in the second example, FIG. 6B is a cross sectional view of the resonance tunnel diode 20 taken along line 6B—6B in FIG. 6A, and FIG. 6C is a cross sectional view of the resonance tunnel diode 20 taken along line 6C—6C in FIG. 6A. FIGS. 7A through 7D, 8A through 8D, 9A through 9D, 10A and 10B illustrate a method for producing the resonance tunnel diode 20. FIGS. 7A, 7C, 8A, 8C, 9A, 9C and 10A are top views, and FIGS. 7B, 7D, 8B, 8D, 9B, 9D and 10B are cross sectional views taken along lines X–X' in FIGS. 7A, 7C, 8A, 8C, 9A, 9C and 10A, respectively. Identical elements discussed in the first example will bear identical reference numerals therewith and the descriptions thereof will be omitted.

As shown in FIGS. 6A, 6B and 6C, the resonance tunnel diode 20 in the second example is the same as the resonance tunnel diode 10 in the first example in that the double-barrier structure 1000 including the silicon thin layer 107 held by the field oxide layer 102 at both ends thereof and the silicon oxide layers 108 provided on top and bottom surfaces of the silicon thin layer 107 are formed in the n-type SOI substrate 90 (FIG. 7B) and in that the double-barrier structure 1000 is sandwiched by the first and second electrodes 111 and 112.

The resonance tunnel diode 20 is different from the resonance tunnel diode 10 in the following point. The silicon thin layer 107 has a uniform thickness in the resonance tunnel diode 10, whereas the silicon thin layer 107 is thinner in an area directly below the second electrode 112 than in the remaining area thereof in the resonance tunnel diode 20. Due to such a structure, even if the area of the silicon thin layer 107 directly below the second electrode 112 acting as the quantum well is as thin as several nanometers, the freestanding part of a silicon island 103 can be supported sufficiently firmly.

When third electrodes 114 are formed for controlling the potential of the quantum well, the area of the silicon thin layer 107 which corresponds to the opening of an inter-level insulation layer 113 is preferably about 50 nm or more in consideration of the process margin. In the second example, the thickness of the area of the silicon thin layer 107 directly below the second electrode 112 can be set to about 10 nm or less so as to provide a satisfactory quantum effect while maintaining the thickness of the remaining area (i.e., the area corresponding to the opening of the inter-level insulating layer 113) of the silicon thin layer 107 to be about 50 nm or more.

With reference to FIGS. 7A through 7D, 8A through 8D, 9A through 9D, 10A, and 10B, a method for producing the resonance tunnel diode 20 will be described.

Figure 7A:
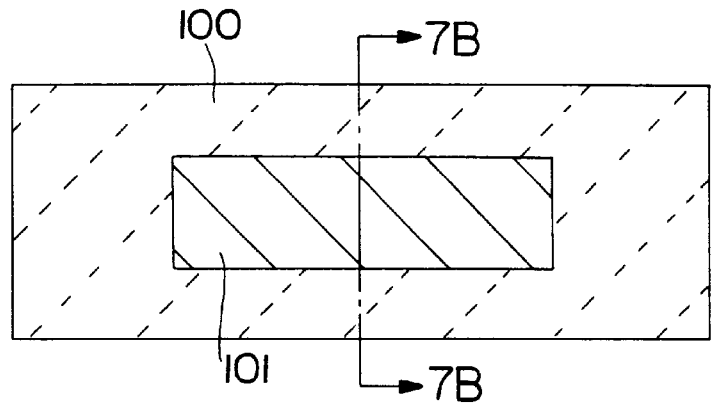
FIGS. 7A, 7C, 8A, 8C, 9A, 9C and 10A are top views illustrating a method for producing the resonance tunnel diode shown in FIG. 6A.
Figure 7B:
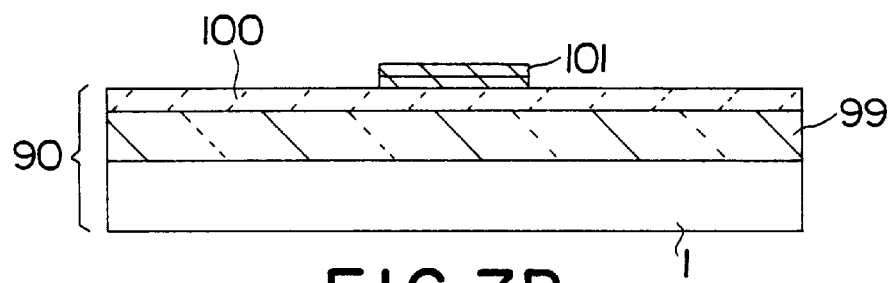
FIGS. 7B, 7D, 8B, 8D, 9B, 9D and 10B are cross sectional views taken along lines 7B—7B, 7D—7D, 8B—8B, 8D—8D, 9B—9B, 9D—9D, and 10B—10B, respectively,in FIGS. 7A, 7C, 8A, 8C, 9A, 9C and 10A, respectively.

The steps shown in FIGS. 7A through 7D are those described in the first example with reference to FIGS. 2A through 2D. First, as shown in FIGS. 7A and 7B, on a silicon-on-insulator (SOI) substrate 90 formed of an n-type silicon substrate 1 having a (001) surface orientation, a buried silicon oxide layer 99 having a thickness of about 400 nm, and a silicon layer 100 having a thickness of about 100 nm, a multi-film layer 101 including a pad oxide film and a nitride film is formed. The pad oxide film is formed to a thickness of about 50 nm by pyrogenic oxidation performed at a temperature of about 900° C. for about 26 minutes, and the nitride film is formed to a thickness of about 120 nm by LPCVD.

Then, the multi-film layer 101 is patterned into a rectangle having a size of about 3 $\mu m \times$ about 10 $\mu m$ by photolithography and dry etching using $O_2$ gas and $CF_4$ gas.

Figure 7C:
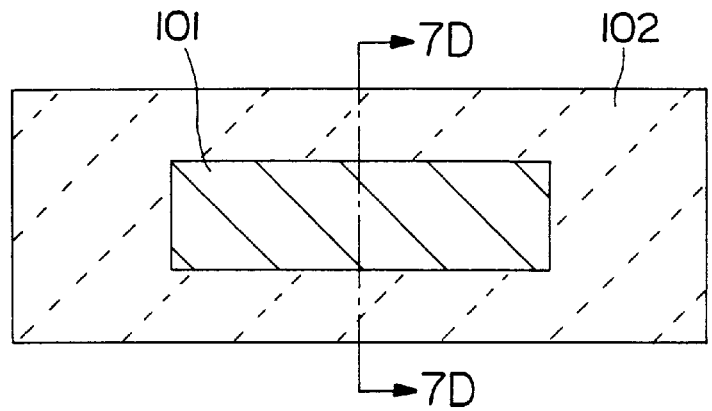
Figure 7D:
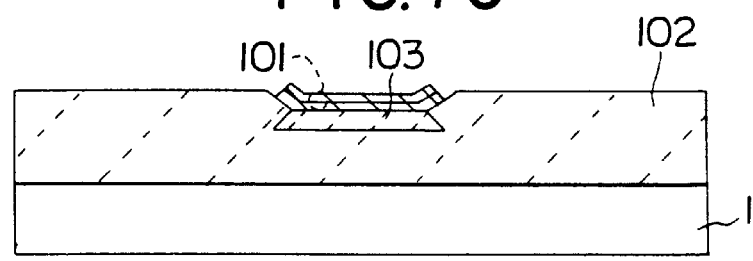

The resultant body is treated with pyrogenic oxidation performed at a temperature of about 1000° C. for about an hour to perform the LOCOS separation. Specifically, the silicon layer 100 is completely oxidized by the pyrogenic oxidation except for the area covered with the multi-film layer 101, and the oxidized area of the silicon layer 100 is coupled with the buried silicon oxide layer 99 to form the field oxide layer 102 as shown in FIGS. 7C and 7D. As a result, a silicon island 103 completely isolated from another silicon island in the adjacent device by the field oxide layer 102 is formed. The silicon island 103 has a thickness of about 77 nm.

The nitride film is etched by hot phosphoric acid at a temperature of about 160° C. for about 80 minutes, and the pad oxide film is etched by 2% buffered hydrogen fluoride acid at a temperature of about 25° C. for about 4 minutes. Thus, the multi-film layer 101 is removed.

Figure 8A:
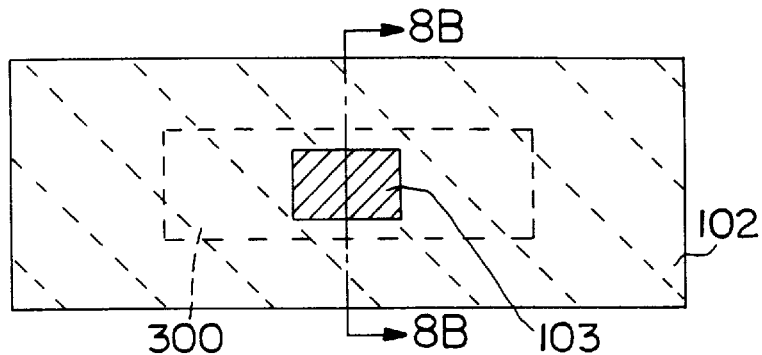
Figure 8B:
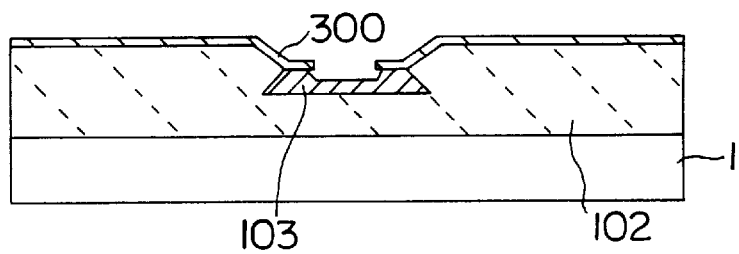

Then, different from the first example, an oxide film is formed to a thickness of about 20 nm by pyrogenic oxidation performed at a temperature of about 900° C. for about 26 minutes. After that, as shown in FIG. 8A, another nitride layer 300 is formed to a thickness of about 120 nm by LPCVD and patterned to have an opening 105 of about 1.5 μm×about 1.5 μm above a central area of the silicon island 103 by photolithography and dry etching using $CH_3F$ gas and $CH_2F_2$ gas (FIG. 8B) using a mask pattern.

The resultant body is treated by pyrogenic oxidation at a temperature of about 1000° C., which is above the threshold temperature for silicon oxide to flow in a viscous state (about 965° C.) to form a silicon oxide layer (not shown) having a thickness of about 152 nm. Then, the silicon oxide layer is removed by etching using 5% buffered hydrogen fluoride acid. By such etching, the thickness of the silicon island 103 exposed by the opening in the another nitride layer 300 becomes about 7 nm, and thus such an area of the silicon island 103 to act as the quantum well is formed. The remaining area of the silicon island 103, which is covered with the nitride layer 300 has a thickness of about 70 nm (see FIGS. 8A and 8B).

Figure 8C:
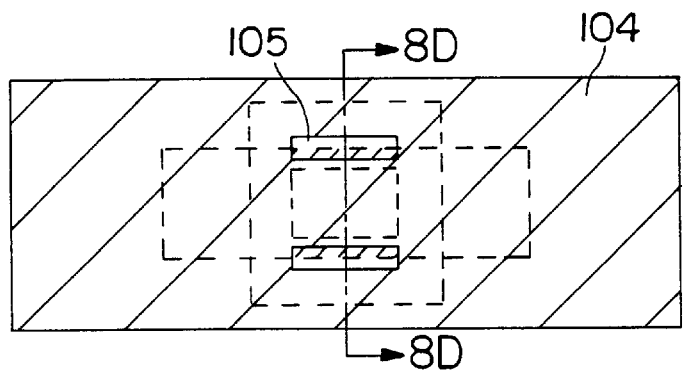
Figure 8D:
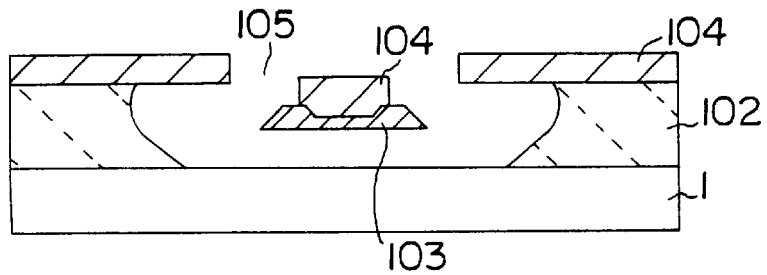

Then, the other nitride layer 300 is removed by etching performed using hot phosphorus at a temperature of about 160° C. for about 80 minutes. As shown in FIG. 8C, a first resist layer 104 is formed on the field oxide layer 102 and patterned to have an opening 105 of about 0.5 μm×about 1 μm using a mask pattern. The resultant body is treated by etching performed by 20% buffered hydrogen fluoride acid for about 10 minutes to remove a part of the field oxide layer 102 directly below the silicon island 103. Thus, as shown in FIG. 8D, the silicon island 103 is partially in a free-standing State.

The resultant body is treated by dry oxidation performed at a temperature of about 700° C. for about 10 minutes to form the silicon oxide layers 108 each having a thickness of about 1.5 nm so as to sandwich the silicon island 103 (i.e., the silicon thin layer 107). The thickness of the silicon island 103 becomes about 5 nm. The silicon oxide layers 108 formed in this manner each act as a tunneling barrier. Another silicon oxide layer 108 is formed on the silicon substrate 1 in this oxidation step.

Figure 9A:
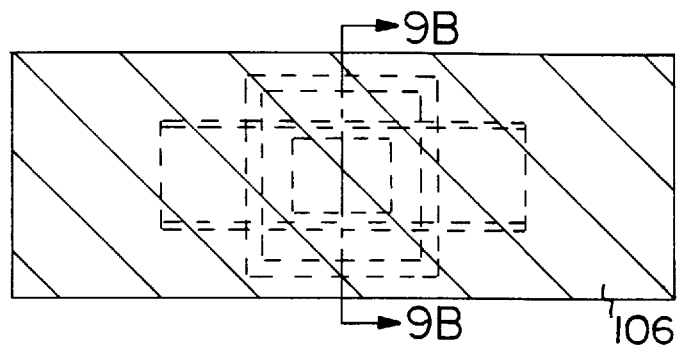
Figure 9B:
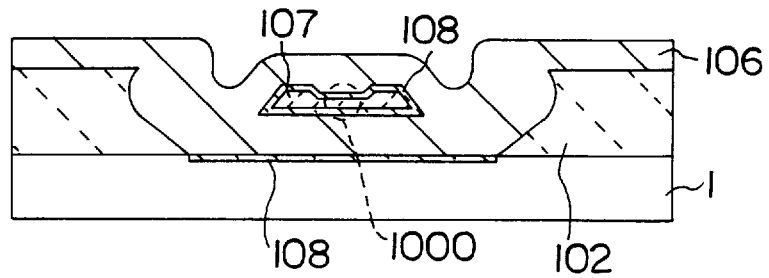

Then, as in the first example, a polycrystalline silicon layer 106 is formed by LPCVD to a thickness of about 300 nm (FIGS. 9A and 9B). The silicon thin layer 107 sandwiched by the silicon oxide layers 108 is covered with the polycrystalline silicon layer 106 in a satisfactory manner due to the good step coverage of the process, and thus the silicon thin layer 107 sandwiched by the silicon oxide layers 108 is completely enclosed by the polycrystalline silicon layer 106.

Next, the polycrystalline silicon layer 106 is doped with phosphorus by high concentration phosphorus diffusion performed at a temperature of about 900° C. for about 20 minutes using $POCl_3$. Specifically, the polycrystalline silicon layer 106 is doped with phosphorus at a concentration of about $1\times10^{19}$ $cm^{-3}$ or more.

Figure 9C:
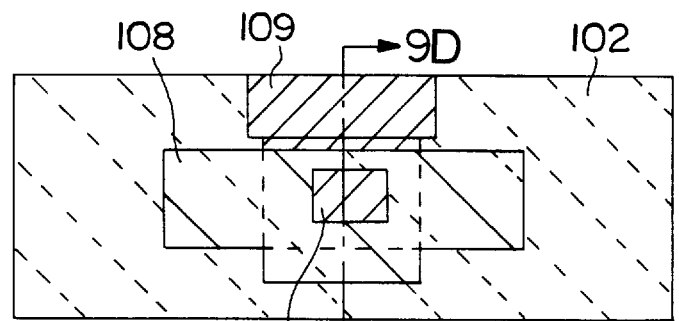
Figure 9D:
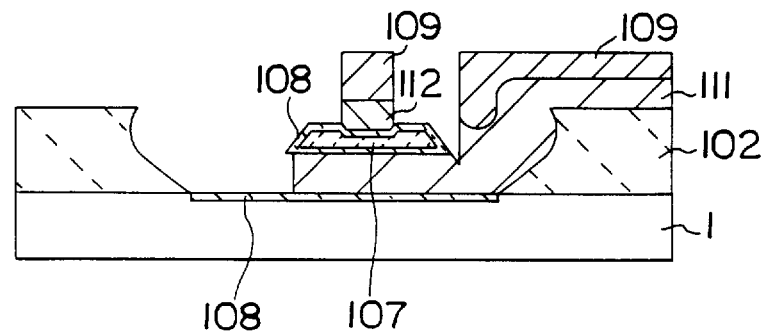

Then, a-second resist layer 109 is formed on the polycrystalline silicon layer 106 by photolithography and patterning as shown in FIG. 9C, and the resultant body is treated by dry etching using $SiCl_4$, $CH_2F_2$, $SF_6$ and $O_2$ gases. Thus, the first electrode 111 having a size of about 1 μm×about 1 μm and the second electrode 112 are formed as shown in FIG. 9D.

Figure 10A:
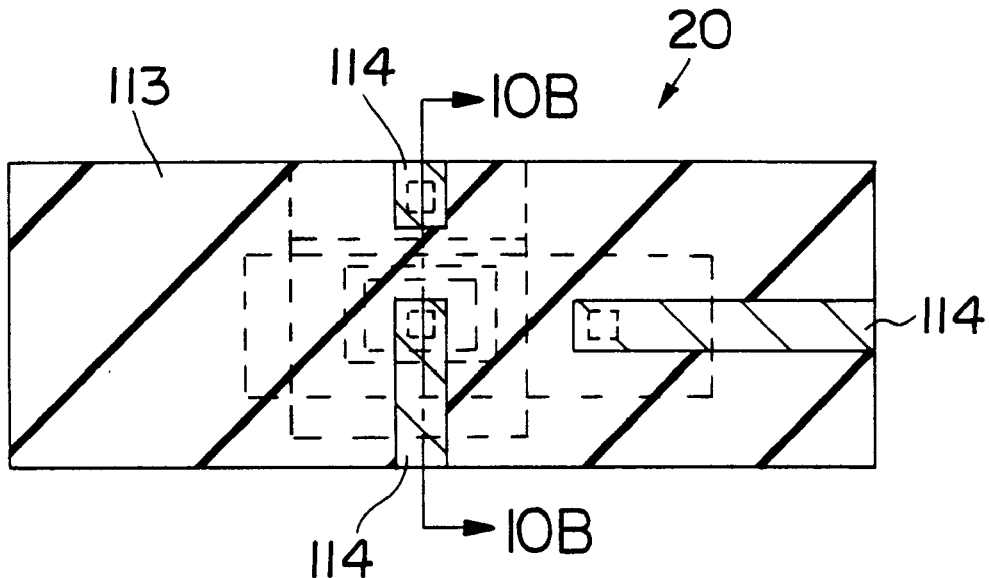
Figure 10B:
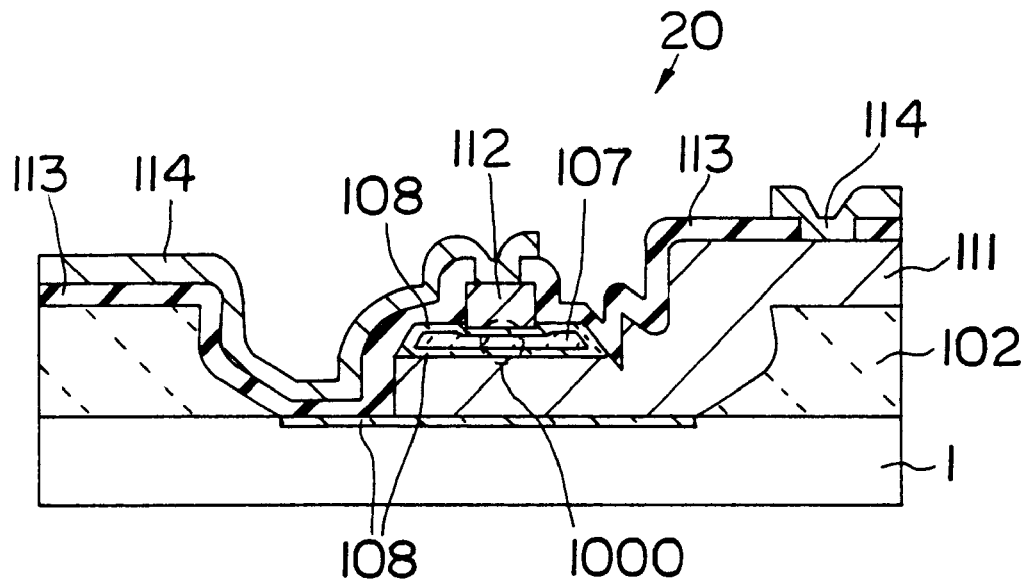

The second resist layer 109 is then removed. As shown in FIGS. 10A and 10B, the inter-level insulation layer 113 is formed on the resultant layer by LPCVD to a thickness of about 200 nm. A mask pattern having openings in positional correspondence with the first and second electrodes 111 and 112 is formed on the interlevel insulation layer 113 by photolithography. Then, the inter-level insulation layer 113 is etched by $CF_4$ gas and $O_2$ gas in accordance with the openings. Next, an aluminum layer is formed by sputtering to a thickness of about 1 μm and then patterned to form the third electrodes 114.

Thus, the resonance tunnel diode 20 is produced. The resonance tunnel diode 20 has the double-barrier structure 1000 of tunneling barrier (silicon oxide layer 108)/quantum well (silicon thin layer 107)/tunneling barrier (silicon oxide layer 108). The resonance tunnel diode 20 further includes the first and second electrodes 111 and 112, and the third electrodes 114 for controlling the potential of the quantum well.

The silicon oxide layers 108, each acting as a tunneling barrier, may be formed via CVD or ozone oxidation instead of thermal oxidation. Each tunneling barrier may be a nitride layer formed by thermal nitrification in a nitride atmosphere or by CVD, a nitrogen oxide layer, or an SiGe, $CaF_2$ or SiC layer formed by crystal growth.

The silicon substrate 1 may have any surface orientation which can form an SOI substrate, as well as the (001) surface orientation.

The silicon layer 100 may be of a p-type conductivity, in which case, the first and second electrodes 111 and 112 are formed of polycrystalline silicon containing p-type impurities diffused therein.

The third electrodes 114 may be formed of another type of metal instead of aluminum.

Instead of forming a silicon island 103 which is completely isolated by partially oxidizing the silicon layer 100, the silicon island 103 may be isolated by performing dry etching of the silicon layer 100 using the multi-film layer 101 including the pad oxide layer/nitride layer as a mask. In such a case, the silicon island is mesa-shaped.

EXAMPLE 3

A resonance tunnel diode 30 in a third example according to the present invention will be described with reference to FIGS. 11A through 15B.

Figure 11A:
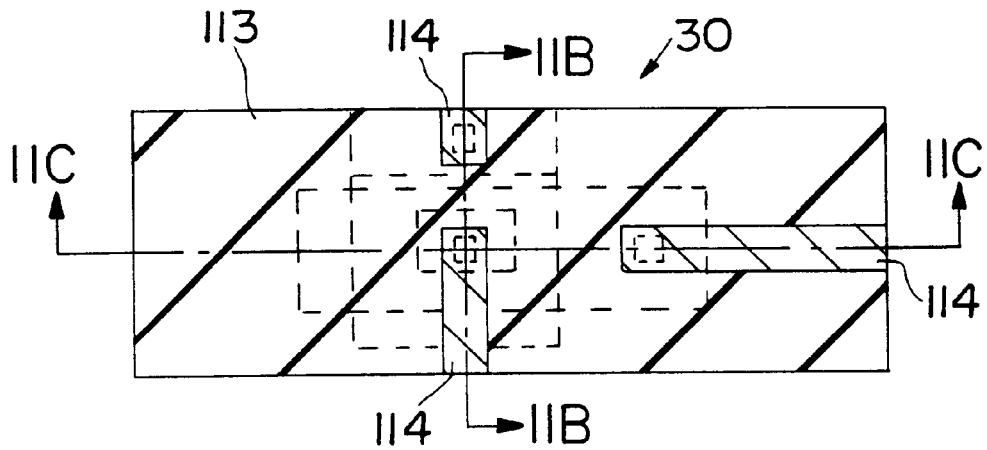
FIG. 11A is a top view of a resonance tunnel diode in a third example according to the present invention.
Figure 11B:
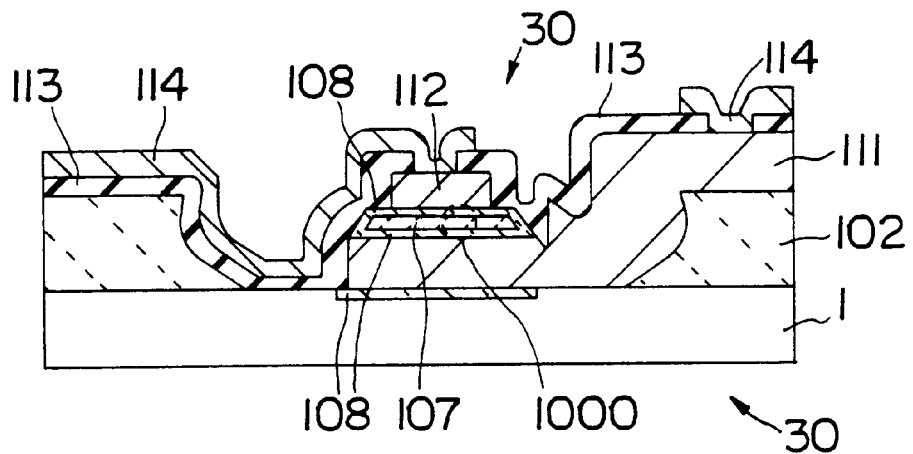
FIG. 11B is a cross sectional view of the resonance tunnel diode shown in FIG. 11A taken along line 11B—11B in FIG. 11A.
Figure 11C:
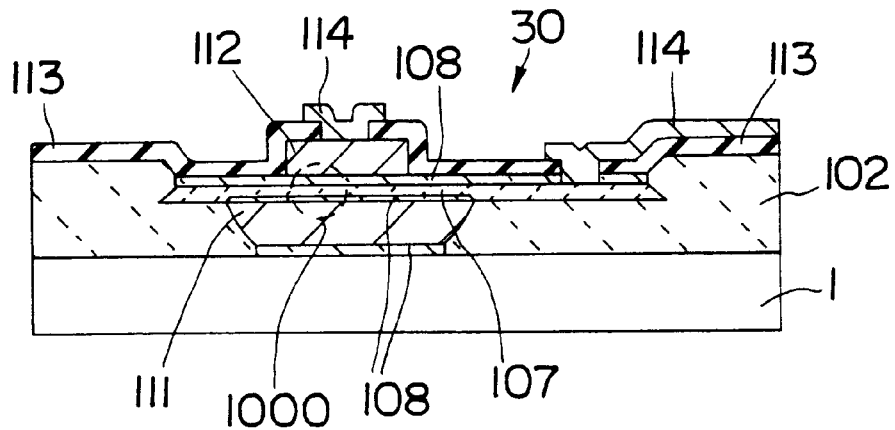
FIG. 11C is a cross sectional view of the resonance tunnel diode shown in FIG. 11A taken along line 11C—11C in FIG. 11A.
Figure 12A:
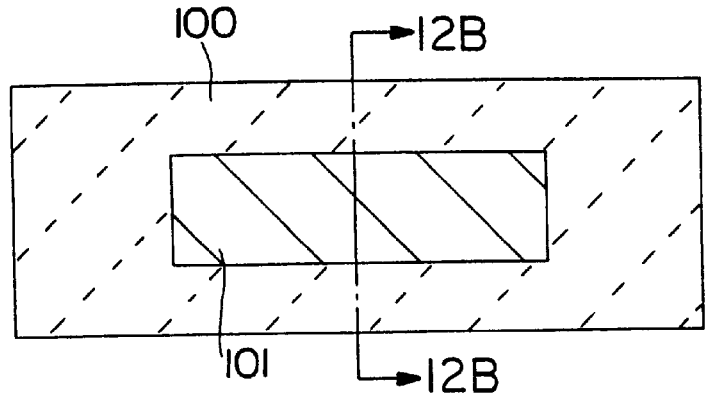
FIGS. 12A, 12C, 13A, 13C, 14A, 14C and 15A are top views illustrating a method for producing the resonance tunnel diode shown in FIG. 11A.
Figure 12B:
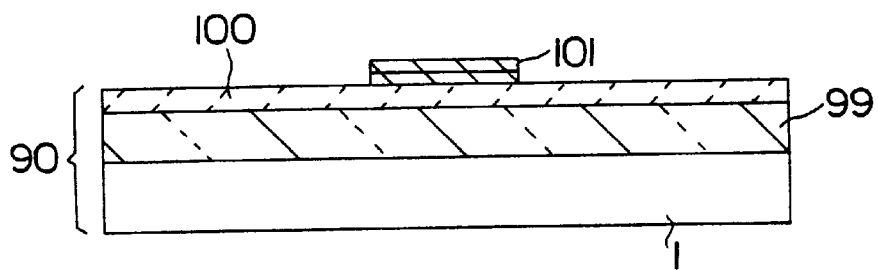
FIGS. 12B, 12D, 13B, 13D, 14B, 14D and 15B are cross sectional views taken along lines 12B—12B, 12D—12D, 13B—13B, 13D—13D, 14B—14B, 14D—14D, and 15B—15B, respectively, in FIGS. 12A, 12C, 13A, 13C, 14A, 14C and 15A, respectively.
Figure 12C:
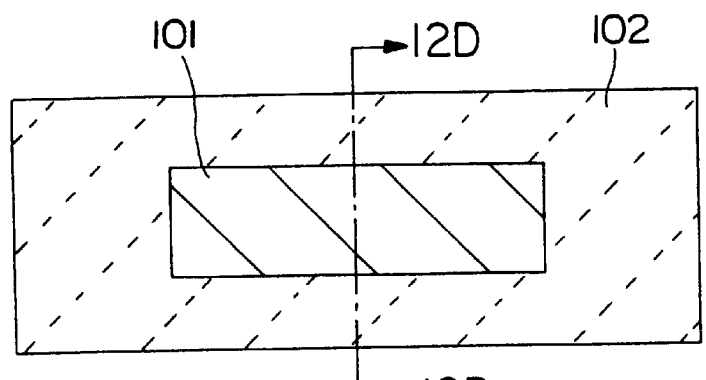
Figure 12D:
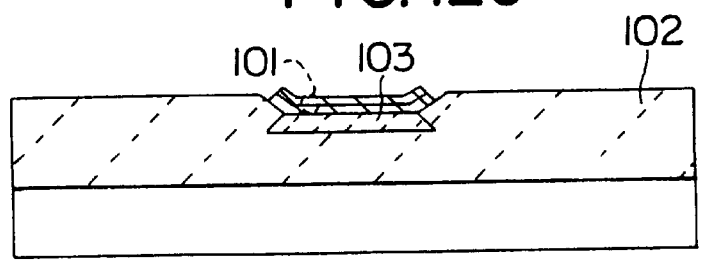

FIG. 11A is a top view of the resonance tunnel diode 30 in the third example, FIG. 11B is a cross sectional view of the resonance tunnel diode 30 taken along line 11B—11B' in FIG. 11A, and FIG. 11C is a cross sectional view of the resonance tunnel diode 30 taken along line 11C—11C in FIG. 11A. FIGS. 12A through 12D, 13A through 13D, 14A through 14D, 15A and 15B illustrate a method for producing the resonance tunnel diode 30. FIGS. 12A, 12C, 13A, 13C, 14A, 14C and 15A are top views, and FIGS. 12B, 12D, 13B, 13D, 14B, 14D and 15B are cross sectional views taken along lines X–X' in FIGS. 12A, 12C, 13A, 13C, 14A, 14C and 15A, respectively. Identical elements discussed in the first example will bear identical reference numerals therewith and the descriptions thereof will be omitted.

The resonance tunnel diode 30 in the third example is different from the resonance tunnel diode 10 in the first example in the following point. The first and second electrodes 111 and 112 are formed of polycrystalline silicon by LPCVD in the resonance tunnel diode 10, whereas the first and second electrodes 111 and 112 are formed of single crystalline silicon by lateral solid phase orientation growth using a region of the silicon substrate 1 exposed through an opening formed in the silicon oxide layer 108 provided on the top surface of the silicon substrate 1 as a seed, as shown in FIG. 11B. The use of single crystalline silicon for the first and second electrodes 111 and 112 instead of polycrystalline silicon significantly reduces the energy level in the forbidden band of silicon. Accordingly, the current leakage via the energy level in the forbidden band and the quantum level in the quantum well can be sufficiently restricted.

With reference to FIGS. 12A through 12D, 13A through 13D, 14A through 14D, 15A, and 15B, a method for producing the resonance tunnel diode 30 will be described.

Figure 13A:
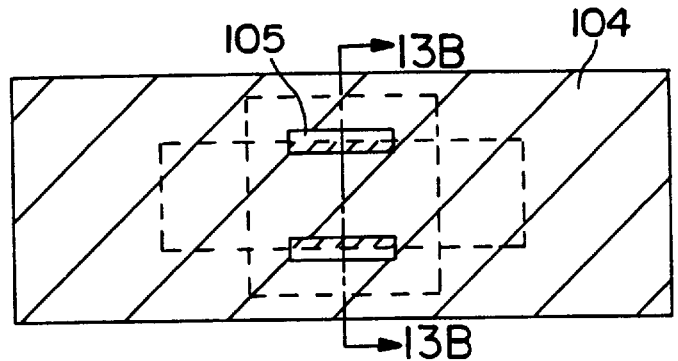
Figure 13B:
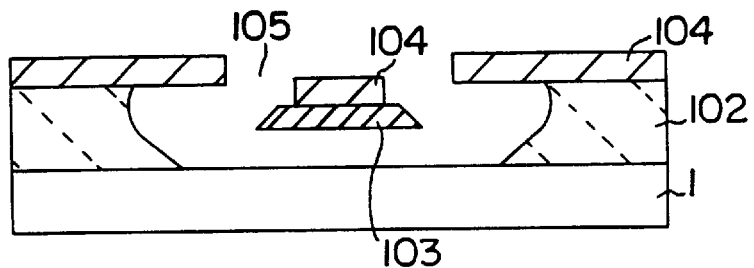

The method in the third example is the same as that in the first example until the silicon island 103 is formed as shown in FIG. 13B (and FIG. 3B) and the silicon oxide layers 108 are formed on the top and bottom surfaces of the silicon thin layer 107 and on the silicon substrate 1, and the description thereof will be omitted.

Figure 13C:
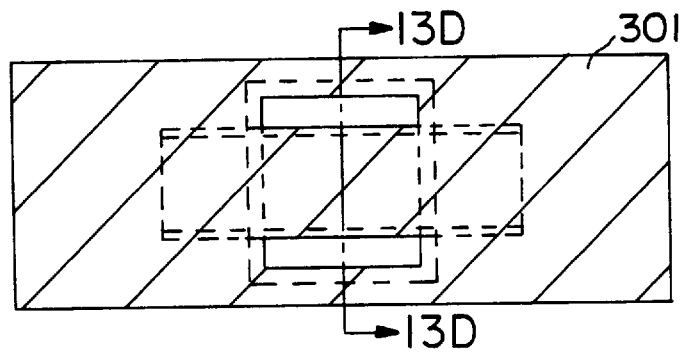
Figure 13D:
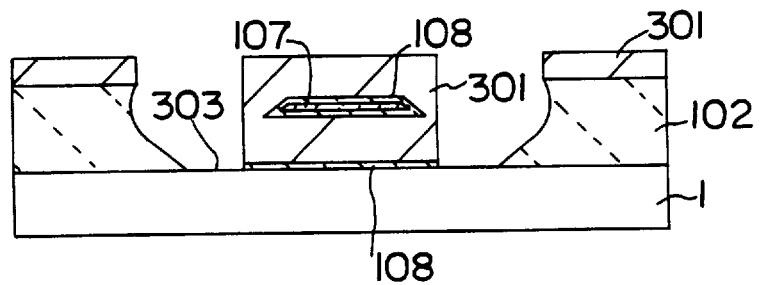

The silicon island 103 is partially put into the free-standing state as shown in FIG. 13B. The first resist 104 is removed, and the silicon oxide layers 108 are formed on the top and bottom surfaces of the silicon island 103 (i.e., the silicon thin layer 107) and on the silicon substrate 1. Thereafter, a second resist layer 301 is formed on the resultant body and patterned to have an opening corresponding to an area of the silicon substrate 1 which is exposed once by etching the field oxide layer 102 using hydrogen fluoride acid for partially putting the silicon island 103 in the free-standing state (FIGS. 13C and 13D). Then, a part of the silicon oxide layer 108 on the silicon substrate 1 corresponding to the opening of the second resist layer 301 is removed by dry etching performed using $O_2$ gas and $CF_4$ gas. The exposed area of the silicon substrate 1 is labelled as 303 in FIG. 13D.

Figure 14A:
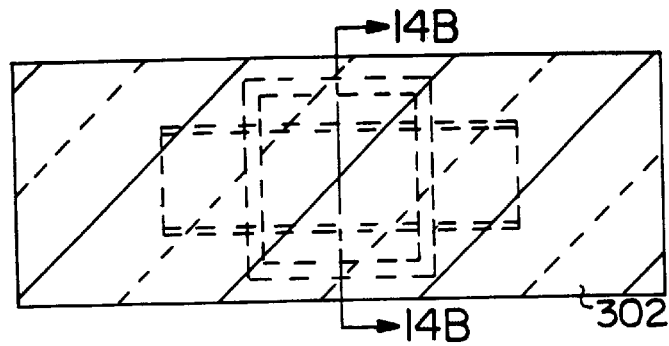
Figure 14B:
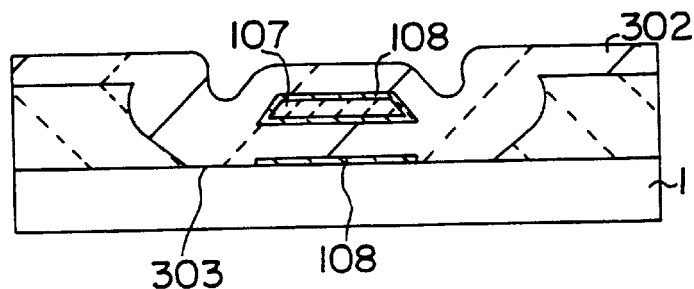
Figure 14C:
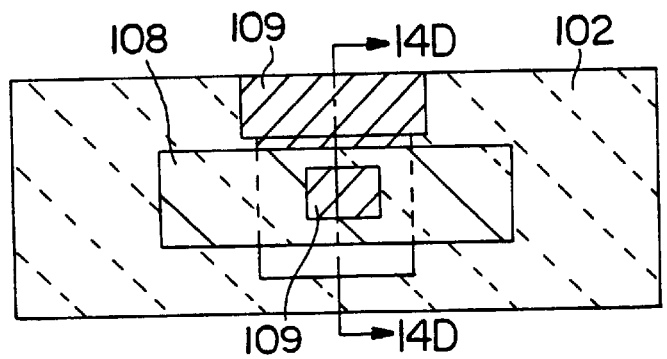
Figure 14D:
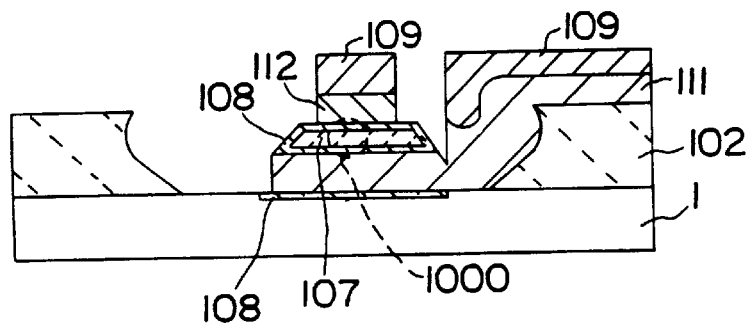
Figure 15A:
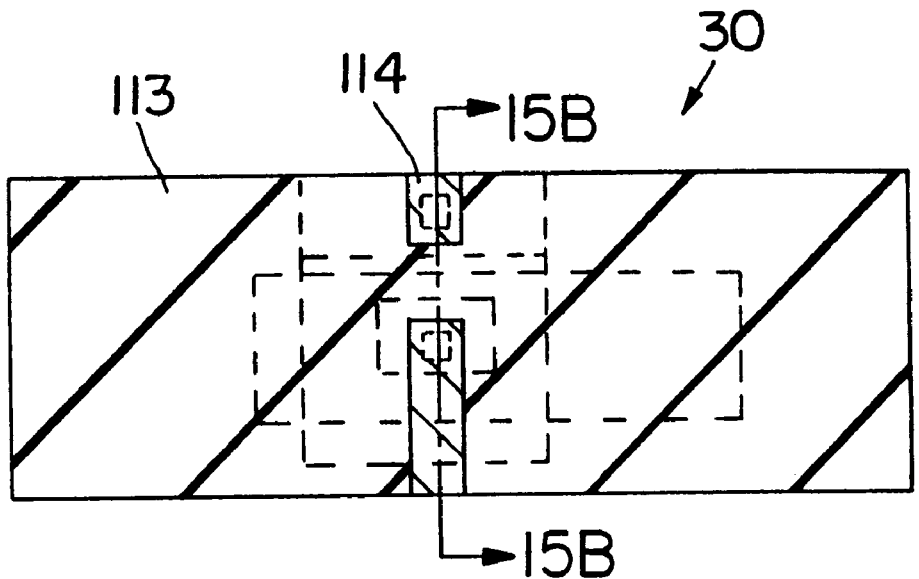
Figure 15B:
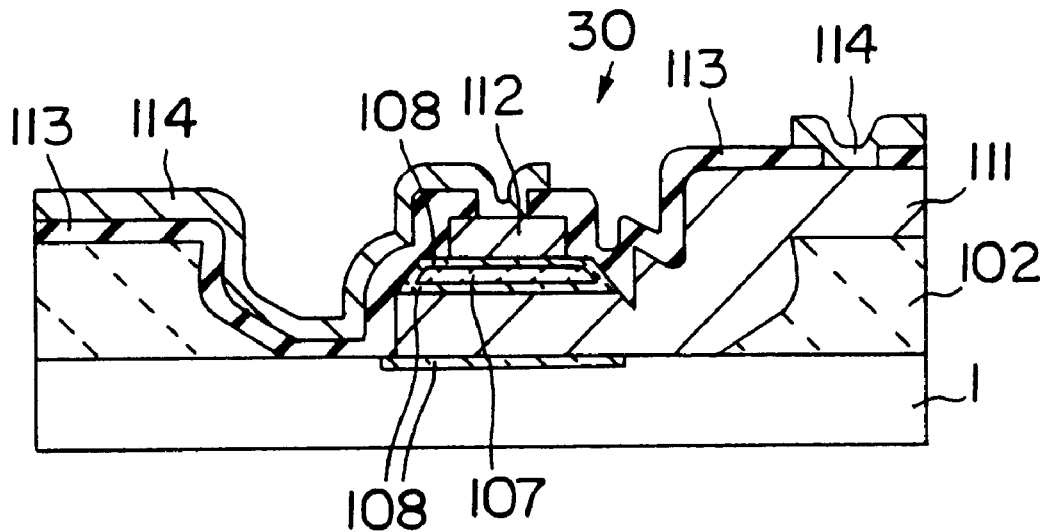

After the second resist layer 301 is removed, amorphous silicon is deposited to a thickness of about 200 nm by thermal decomposition performed at a reaction temperature of about 550° C. to about 580° C. using silane gas as a material gas. Phosphorus atoms are implanted into the amorphous silicon at a concentration of about $2 \times 10^{15}$ $cm^{-2}$. Then, lateral solid phase orientation growth is performed by heating at a temperature of the silicon substrate 1 of about 600° C. for about 7 hours. Thus, a single crystalline silicon layer 302 is grown from the seed 303 as shown in FIGS. 14A and 14B. The single crystalline silicon layer 302 contains phosphorus at a concentration of as high as $1 \times 10^{20}$ $cm^{-3}$.

The steps thereafter for producing the resonance tunnel diode 30 are the same as those in the first example, and the description thereof will be omitted.

The resonance tunnel diode 30 has the double-barrier structure 1000 of tunneling barrier (silicon oxide layer 108)/quantum well (silicon thin layer 107)/tunneling barrier (silicon oxide layer 108). The resonance tunnel diode 30 further includes the first and second electrodes 111 and 112, and the third electrodes 114 for controlling the potential of the quantum well.

The silicon oxide layers 108, each acting as a tunneling barrier, may be formed CVD or ozone oxidation instead of thermal oxidation. Each tunneling barrier may be a nitride layer formed by thermal nitrification in a nitride atmosphere or by CVD, a nitrogen oxide layer, or an SiGe, $CaF_2$ or SiC layer formed by crystal growth.

The silicon substrate 1 may have any surface orientation which can form an SOI substrate, as well as the (001) surface orientation.

The silicon layer 100 may be of a p-type conductivity, in which case, the first and second electrodes 111 and 112 are formed of polycrystalline silicon containing p-type impurities diffused therein.

The third electrodes 114 may be formed of another type of metal instead of aluminum.

Instead of forming a silicon island 103 which is completely isolated by partially oxidizing the silicon layer 100, the silicon island 103 may be isolated by performing dry etching of the silicon layer 100 using the multi-film layer 101 including the pad oxide layer/nitride layer as a mask. In such a case, the silicon island is mesa-shaped.

EXAMPLE 4

A resonance tunnel diode 40 in a fourth example according to the present invention will be described with reference to FIGS. 16A through 20.

Figure 16A:
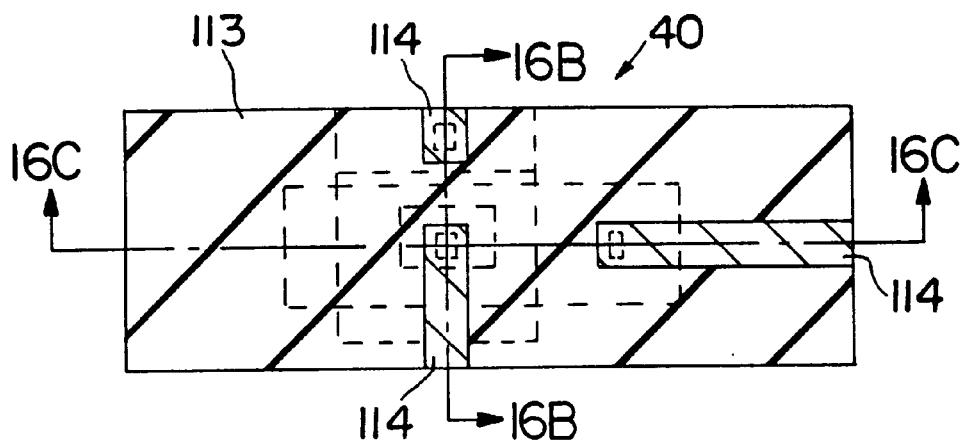
FIG. 16A is a top view of a resonance tunnel diode in a fourth example according to the present invention.
Figure 16B:
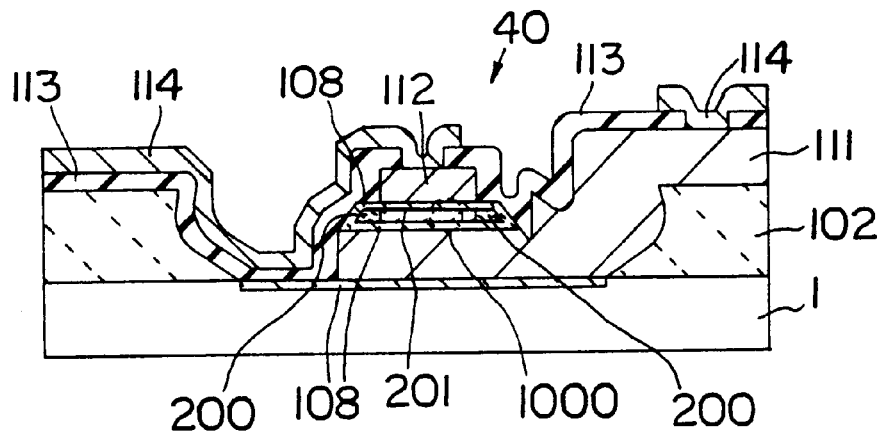
FIG. 16B is a cross sectional view of the resonance tunnel diode shown in FIG. 16A taken along line 16B—16B in FIG. 16A.
Figure 16C:
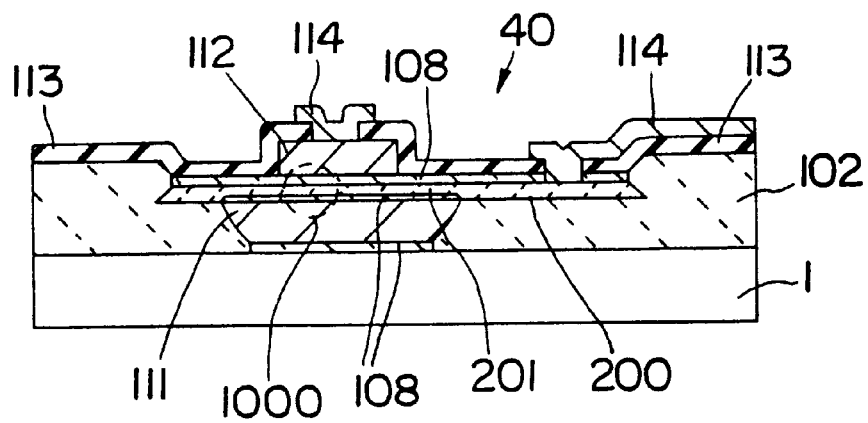
FIG. 16C is a cross sectional view of the resonance tunnel diode shown in FIG. 16A taken along line 16C—16C in FIG. 16A.
Figure 17A:
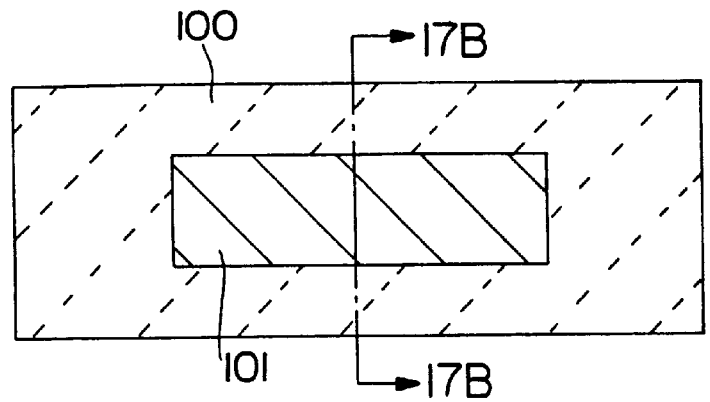
FIGS. 17A, 17C, 18A, 18C, 19A and 19C are top views illustrating a method for producing the resonance tunnel diode shown in FIG. 16A.
Figure 17B:
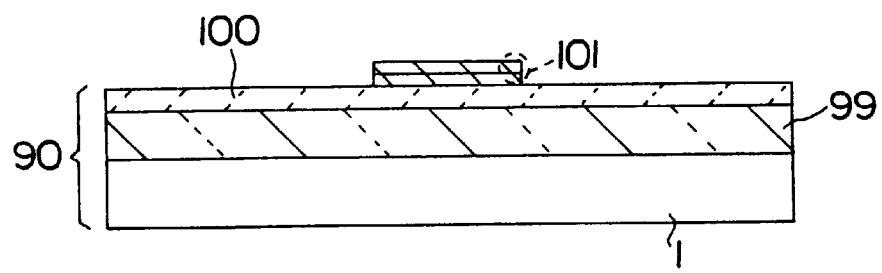
FIGS. 17B, 17D, 18B, 18D, 19B and 19D are cross sectional views taken along lines X–X' in FIGS. 17A, 17C, 18A, 18C, 19A and 19C, respectively.
Figure 17C:
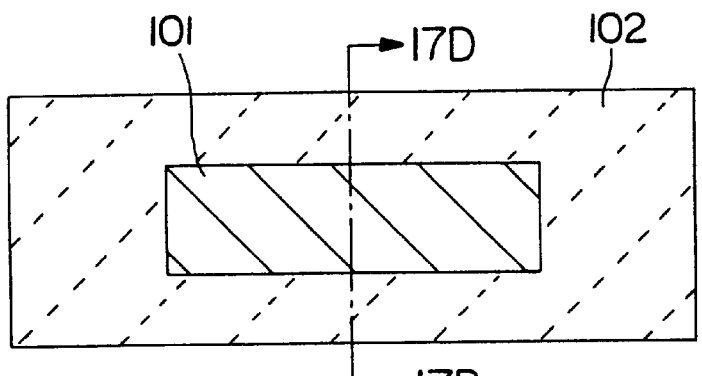
Figure 17D:
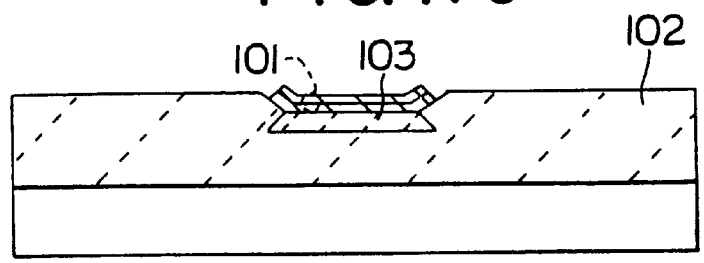

FIG. 16A is a top view of the resonance tunnel diode 40 in the fourth example, FIG. 16B is a cross sectional view of the resonance tunnel diode 40 taken along line 16B—16B in FIG. 16A, and FIG. 16C is a cross sectional view of the resonance tunnel diode 40 taken along line 16C—16C in FIG. 16A. FIGS. 17A through 17D, 18A through 18D, and 19A through 19D illustrate a method for producing the resonance tunnel diode 40. FIGS. 17A, 17C, 18A, 18C, 19A and 19C are top views, and FIGS. 17B, 17D, 18B, 18D, 19B and 19D are cross sectional views taken along lines X–X' in FIGS. 17A, 17C, 18A, 18C, 19A and 19C, respectively. Identical elements discussed in the first example will bear identical reference numerals therewith and the descriptions thereof will be omitted.

The resonance tunnel diode 40 in the fourth example is different from the resonance tunnel diode 10 in the first example in the following point. The silicon thin layer 107 is of an n-type conductivity in the resonance tunnel diode 10, whereas the silicon thin layer 107 is of an n-type conductivity in an area directly below the second electrode 112 and is of an p-type conductivity in the remaining area in the resonance tunnel diode 40. In this example, the n-type area of the silicon thin layer 107 will be referred to as the "n-type silicon thin layer 201", and the p-type area of the silicon thin layer 107 will be referred to as the "p-type silicon thin layer 200" (FIGS. 16B and 16C).

The n-type silicon thin layer 201 contains impurities preferably at a concentration of as low as about $1 \times 10^{15}$ $cm^{-3}$ or less in order to restrict the spreading quantum level caused by impurity diffusion, and the p-type silicon thin layer 200 contains impurities at a concentration of about $1 \times 10^{16}$ $cm^{-3}$ or more.

The third electrodes 114 are provided for controlling the potential of the quantum well through a part of the p-type silicon thin layer 200. When the p-type silicon thin layer 200 is supplied with a reverse bias voltage, i.e., a negative voltage to expand the depletion layer of the p-n junctions between the n-type and p-type silicon thin layers 201 and 200, the effective surface area of the resonance tunnel diode 40 can be reduced.

When an optimum value of the reverse bias voltage is applied to the p-type silicon thin layer 200 to reduce the surface area of the resonance tunnel diode 40 to about 100 nm$^2$ (about 10 nm×about 10 nm) or less, the quantum well becomes a silicon quantum dot. Accordingly, the state density function of the quantization level has a delta function-like shape. Thus, the resonance tunnel diode 40 can have an extremely high peak/valley ratio. Since intervals between the quantization levels are also increased, the voltage to be applied to the first and second electrodes 111 and 112 when the peak current flows is also increased. By changing the voltage to be applied to the quantum well, the I–V characteristic can be controlled.

With reference to FIGS. 17A through 17D, 18A through 18D, and 19A through 19D, a method for producing the resonance tunnel diode 40 will be described.

Figure 18A:
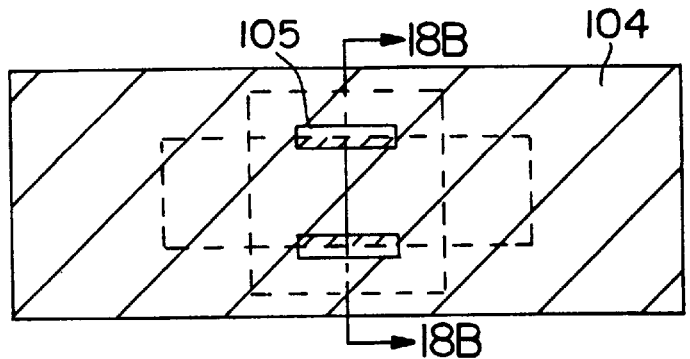
Figure 18B:
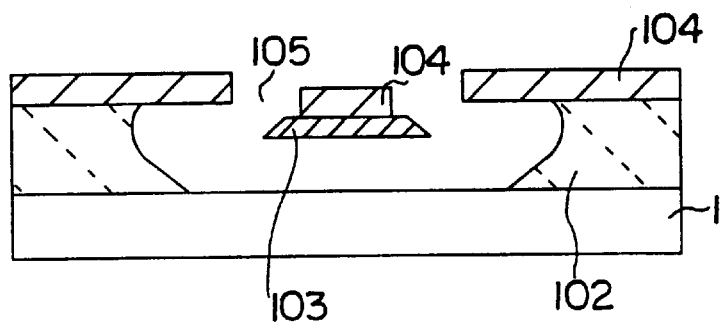
Figure 18C:
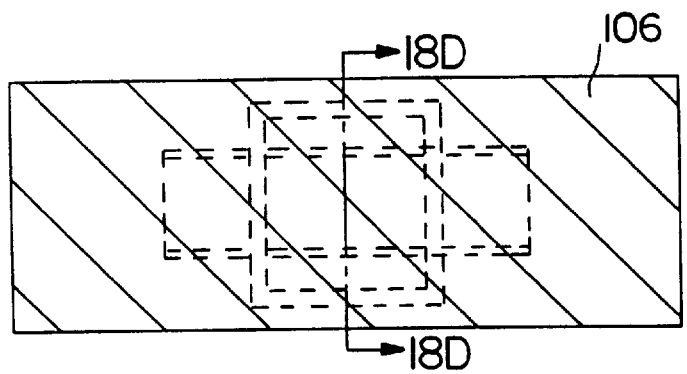
Figure 18D:
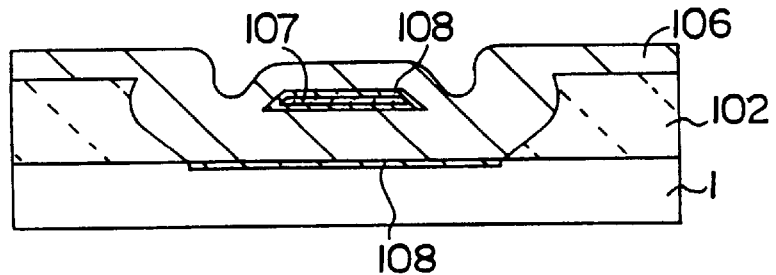

The method in the fourth example is the same as that in the first example until the polycrystalline silicon layer 106 is formed as shown in FIGS. 18C and 18D (and FIGS. 3C and 3D), and the description thereof will be omitted.

Figure 19A:
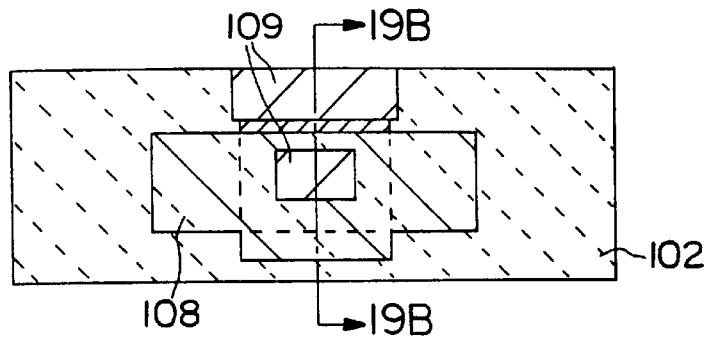
Figure 19B:
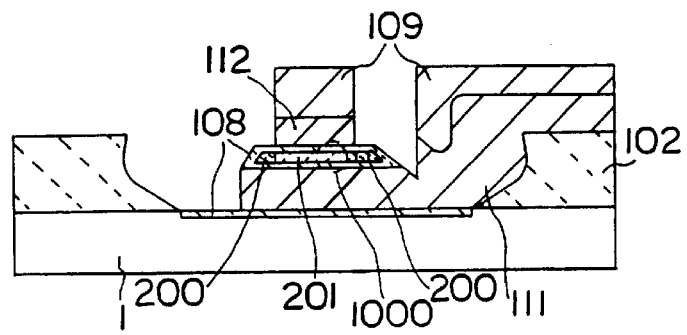

After the polycrystalline silicon layer 106 is formed, phosphorus is implanted into the polycrystalline silicon layer 106 at a concentration of about $1 \times 10^{19}$ cm$^{-3}$ by high concentration phosphorus diffusion performed at a temperature of about 900° C. for about 20 minutes using POCl$_3$ gas. Then, as shown in FIG. 19A, a second resist layer 109 is formed on the polycrystalline silicon layer 106 by photolithography and patterning, and the resultant body is treated by dry etching performed using SiCl$_4$, CH$_2$F$_2$, SF$_6$ and O$_2$ gases. Thus, as shown in FIG. 19B, the first and second electrodes 111 and 112 are formed. The second electrode 112 formed above the silicon thin layer 107 has a square shape of about 1 μm×about 1 μm.

Figure 19C:
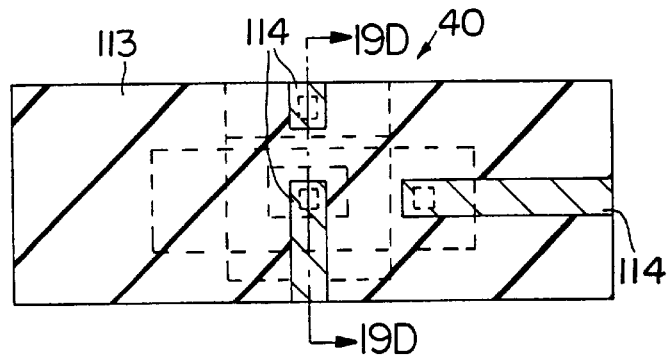
Figure 19D:
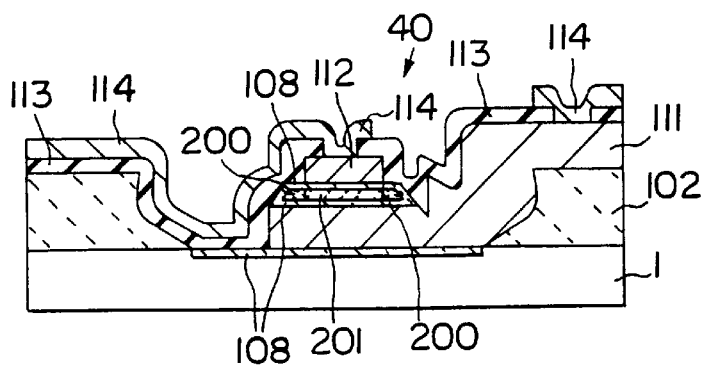

While the second resist layer 109 is left as it is, the silicon thin layer 107 is doped with BF$_2$$^+$ ions at an acceleration voltage of about 40 keV through the tunnel silicon oxide films 108, thereby causing the silicon thin layer 107 to be of a p-type conductivity except for the area directly below the second electrode 112. Thus, the n-type silicon thin layer 201 and the p-type silicon thin layer 200 are formed (FIGS. 19C and 19D).

After the second resist layer 109 is removed, the resultant body is heated at a temperature of about 900° C. for about 20 minutes in a nitrogen atmosphere to activate the p-type impurities.

The steps thereafter for producing the resonance tunnel diode 40 are the same as those in the first example, and the description thereof will be omitted.

The resonance tunnel diode 40 has the double-barrier structure 1000 of tunneling barrier (silicon oxide layer 108)/quantum well (silicon thin layer 107)/tunneling barrier (silicon oxide layer 108). The resonance tunnel diode 40 further includes the first and second electrodes 111 and 112, and the third electrodes 114 for controlling the potential of the quantum well.

The silicon oxide layers 108, each acting as a tunneling barrier, may be formed via CVD or ozone oxidation instead of thermal oxidation. Each tunneling barrier may be a nitride layer formed by thermal nitrification in a nitride atmosphere or by CVD, a nitrogen oxide layer, or an SiGe, CaF$_2$ or SiC layer formed by crystal growth.

The silicon substrate 1 may have any surface orientation which can form an SOI substrate, as well as the (001) surface orientation.

The silicon layer 100 may be of a p-type conductivity, in which case, the first and second electrodes 111 and 112 are formed of polycrystalline silicon containing p-type impurities diffused therein.

The third electrodes 114 may be formed of another type of metal instead of aluminum.

Instead of forming a silicon island 103 which is completely isolated by partially oxidizing the silicon layer 100, the silicon island 103 may be isolated by performing dry etching of the silicon layer 100 using the multi-film layer 101 including the pad oxide layer/nitride layer as a mask. In such a case, the silicon island is mesa-shaped.

Hereinafter, the I–V characteristics of the resonance tunnel diode 40 in the fourth example will be described.

In FIG. 20, curve 1300 represents the I–V characteristic of the resonance tunnel diode 40 obtained when no bias voltage is applied thereto. Curve 1400 represents the I–V characteristic thereof obtained between the first and second electrodes 111 and 112 when a reverse bias voltage is applied thereto. Specifically, the reverse bias voltage is applied using the third electrode 114 to the p-n junction between the n-type and p-type silicon thin layers 201 and 200.

In FIG. 20, the peak current Ip is obtained when the quantization level in the n-type silicon thin layer 201 is equal to the Fermi level of electrons in the first electrode 111. When a reverse bias voltage is applied to the p-n junction between the n-type and p-type silicon thin layers 201 and 200, the depletion layer expands toward the n-type silicon thin layer 201. Therefore, the effective surface area of the resonance tunnel diode 40 decreases while the effect of confining electrons is increased. Thus, the intervals between the quantization levels are increased. As a result, the peak voltage causing the peak current Ip shifts toward higher voltages. As the surface area of the resonance tunnel diode 40 is decreased, the value of the peak current Ip is decreased.

Due to such phenomena, by changing the reverse bias voltage to be applied to the quantum well, the I–V characteristic of the resonance tunnel diode 40 can be controlled. Thus, the operational point thereof can be changed.

EXAMPLE 5

A resonance tunnel diode 50 in a fifth example according to the present invention will be described with reference to FIGS. 21A through 24D.

Figure 21A:
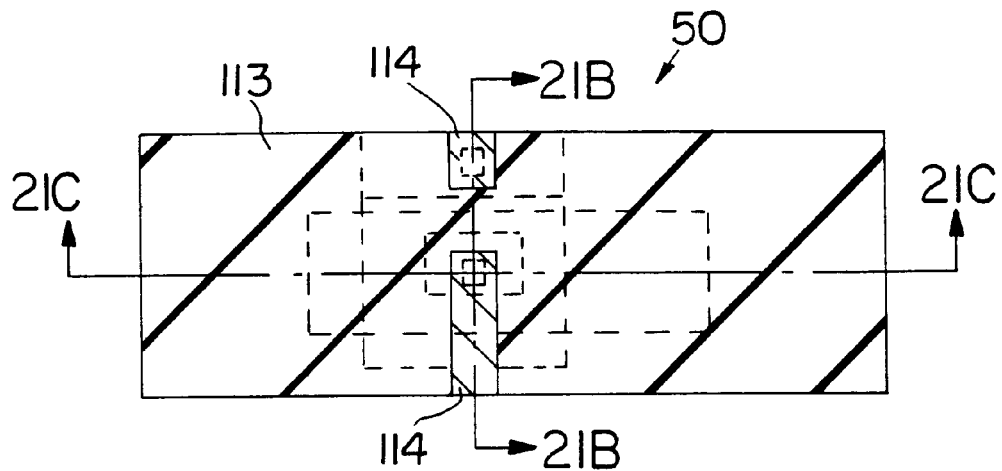
FIG. 21A is a top view of a resonance tunnel diode in a fifth example according to the present invention.
Figure 21B:
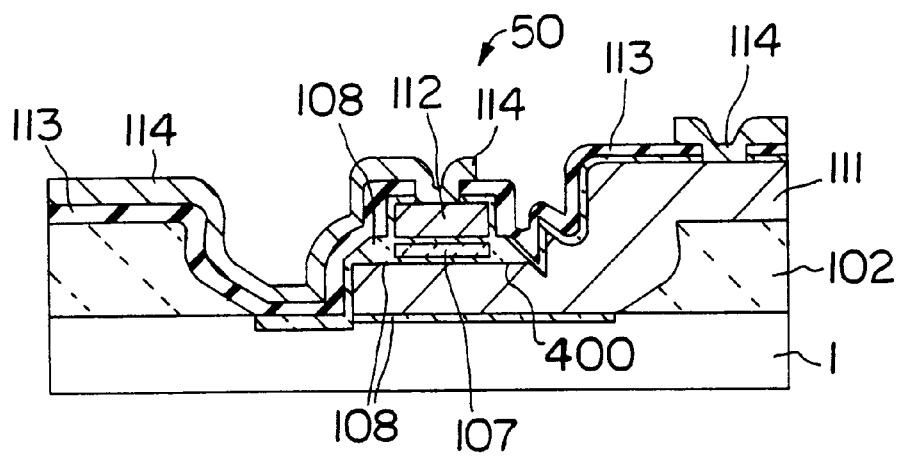
FIG. 21B is a cross sectional view of the resonance tunnel diode shown in FIG. 21A taken along line 21B—21B in FIG. 21A.
Figure 21C:
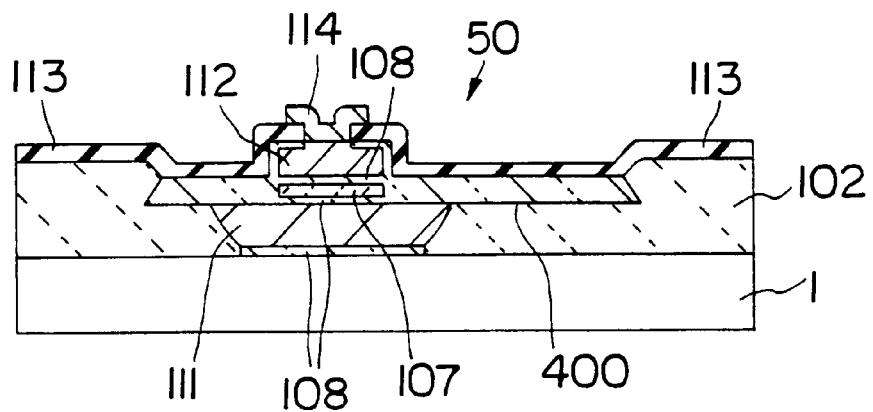
FIG. 21C is a cross sectional view of the resonance tunnel diode shown in FIG. 21A taken along line 21C—21C in FIG. 21A.
Figure 22A:
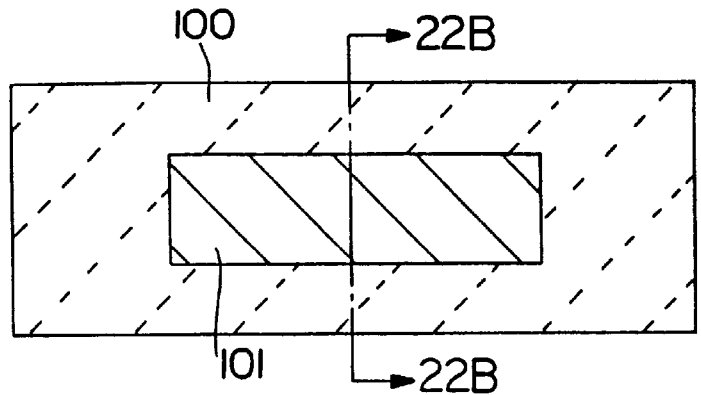
FIGS. 22A, 22C, 23A, 23C, 24A and 24C are top views illustrating a method for producing the resonance tunnel diode shown in FIG. 21A.
Figure 22B:
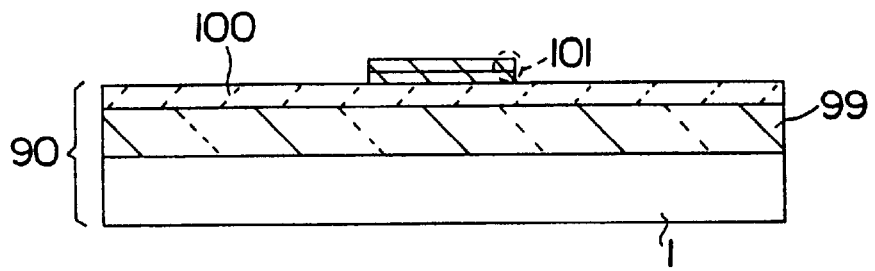
FIGS. 22B, 22D, 23B, 23D, 24B and 24D are cross sectional views taken along lines X–X' in FIGS. 22A, 22C, 23A, 23C, 24A and 24C, respectively.
Figure 22C:
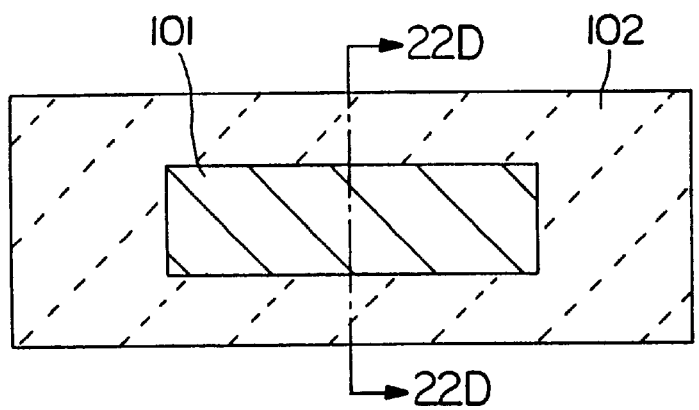
Figure 22D:
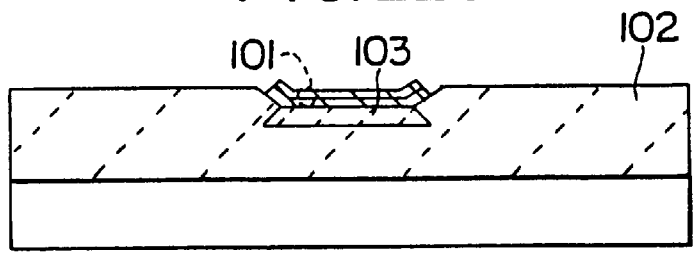
Figure 23A:
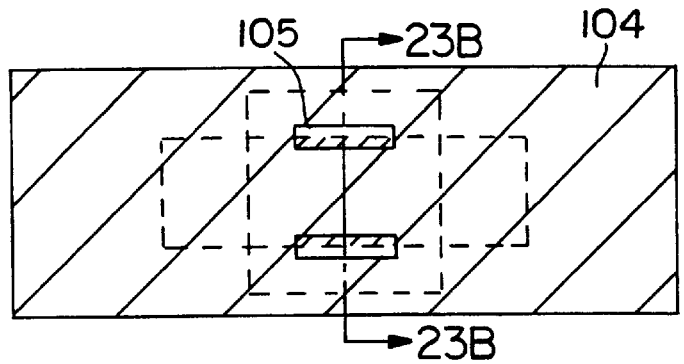
Figure 23B:
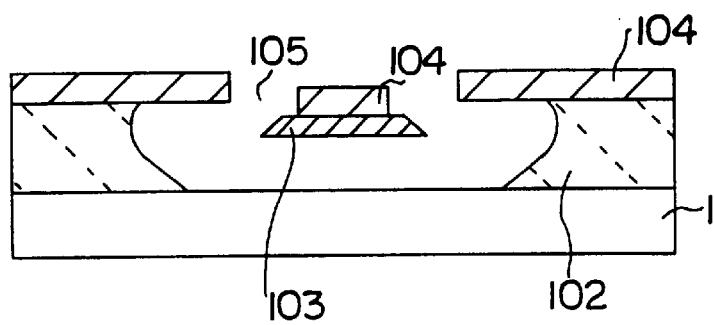
Figure 23C:
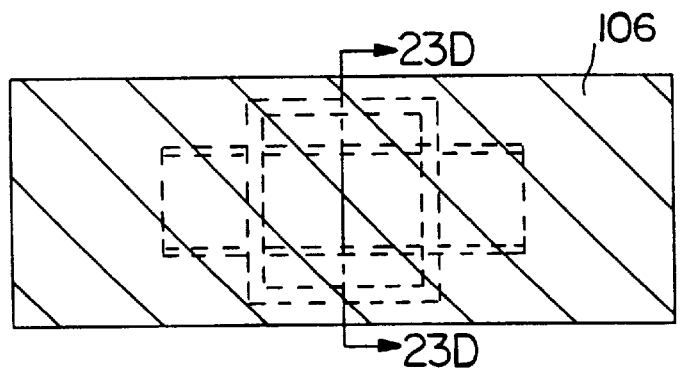
Figure 23D:
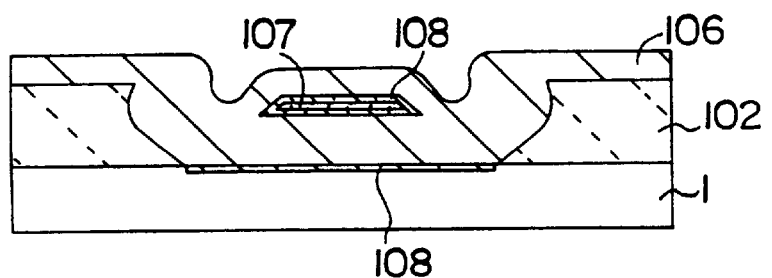

FIG. 21A is a top view of the resonance tunnel diode 50 in the fifth example, FIG. 21B is a cross sectional view of the resonance tunnel diode 50 taken along line 21B—21B in FIG. 21A, and FIG. 21C is a cross sectional view of the resonance tunnel diode 50 taken along line 21C—21C in FIG. 21A. FIGS. 22A through 22D, 23A through 23D, and 24A through 24D illustrate a method for producing the resonance tunnel diode 50. FIGS. 22A, 22C, 23A, 23C, 24A and 24C are top views, and FIGS. 22B, 22D, 23B, 23D, 24B and 24D are cross sectional views taken along lines X–X' in FIGS. 22A, 22C, 23A, 23C, 24A and 24C, respectively. Identical elements discussed in the first example will bear identical reference numerals therewith and the descriptions thereof will be omitted.

The resonance tunnel diode 50 in the fifth example is different from the resonance tunnel diode 10 in the first example in the following point. In the resonance tunnel diode 50, the silicon thin layer 107 is provided only directly below the second electrode 112, and a silicon oxide layer 108 exists in the other area where the silicon thin layer 107 is provided in the resonance tunnel diode 10 (FIGS. 21B and 21C). In this example, such extended silicon oxide layers 108 will be referred to as the "silicon oxide thin layers 400". Due to such a structure, the leakage current path is substantially limited. As a result, the valley current is sufficiently decreased to obtain a sufficiently high peak/valley ratio.

With reference to FIGS. 22A through 22D, 23A through 23D, and 24A through 24D, a method for producing the resonance tunnel diode 50 will be described.

Figure 24A:
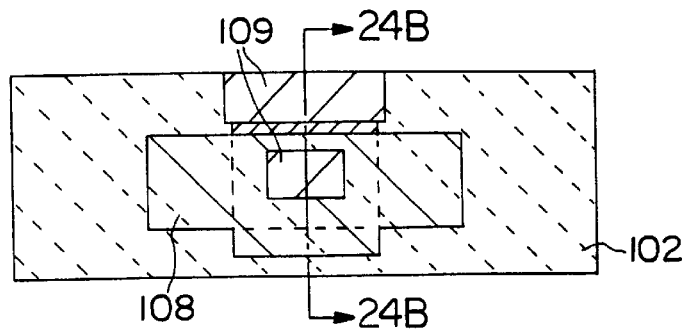
Figure 24B:
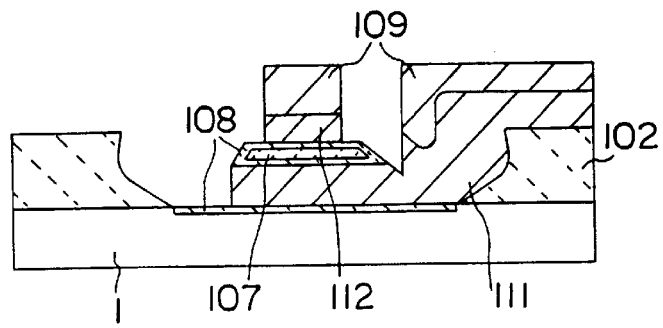
Figure 24C:
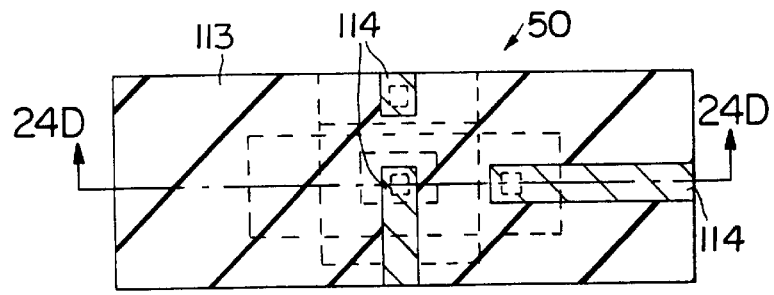
Figure 24D:
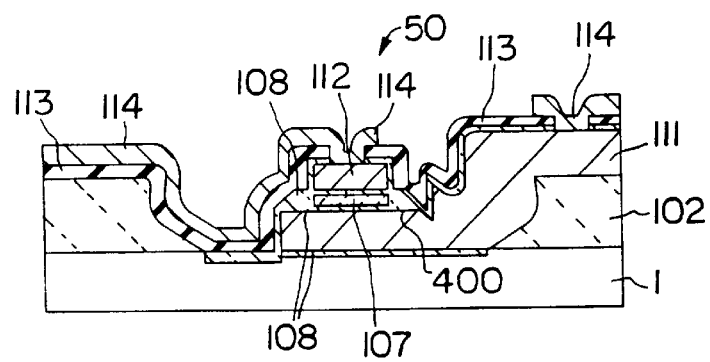

The method in the fifth example is the same as that in the first example until the first and the second electrodes 111 and 112 are formed as shown in FIGS. 24A and 24B (and FIGS. 4A and 4B), and the description thereof will be omitted.

After the second resist layer 109 is removed, the resultant body is treated by pyrogenic oxidation performed at a temperature of about 900° C. for about 10 minutes to form a silicon oxide film having a thickness of about 20 nm. By such treatment, surfaces of the first and second electrodes 111 and 112 formed of polycrystalline silicon are oxidized, and the silicon thin layer 107 is turned into the silicon oxide thin layers 400 except for the area directly below the second electrode 112.

The steps thereafter for producing the resonance tunnel diode 50 are the same as those in the first example, and the description thereof will be omitted.

The resonance tunnel diode 50 has the double-barrier structure 1000 of tunneling barrier (silicon oxide layer 108)/quantum well (silicon thin layer 107)/tunneling barrier (silicon oxide layer 108). The resonance tunnel diode 50 further includes the first and second electrodes 111 and 112, and the third electrodes 114 for controlling the potential of the quantum well.

The silicon oxide layers 108, each acting as a tunneling barrier, may be formed via CVD or ozone oxidation instead of thermal oxidation. Each tunneling barrier may be a nitride layer formed by thermal nitrification in a nitride atmosphere or by CVD, a nitrogen oxide layer, or an SiGe, CaF$_2$ or SiC layer formed by crystal growth.

The silicon substrate 1 may have any surface orientation which can form an SOI substrate, as well as the (001) surface orientation.

The silicon layer 100 may be of a p-type conductivity, in which case, the first and second electrodes 111 and 112 are formed of polycrystalline silicon containing p-type impurities diffused therein.

The third electrodes 114 may be formed of another type of metal instead of aluminum.

Instead of forming a silicon island 103 which is completely isolated by partially oxidizing the silicon layer 100, the silicon island 103 may be isolated by performing dry etching of the silicon layer 100 using the multi-film layer 101 including the pad oxide layer/nitride layer as a mask. In such a case, the silicon island is mesa-shaped.

EXAMPLE 6

A resonance tunnel diode 60 in a sixth example according to the present invention will be described with reference to FIGS. 25A through 29B.

Figure 25A:
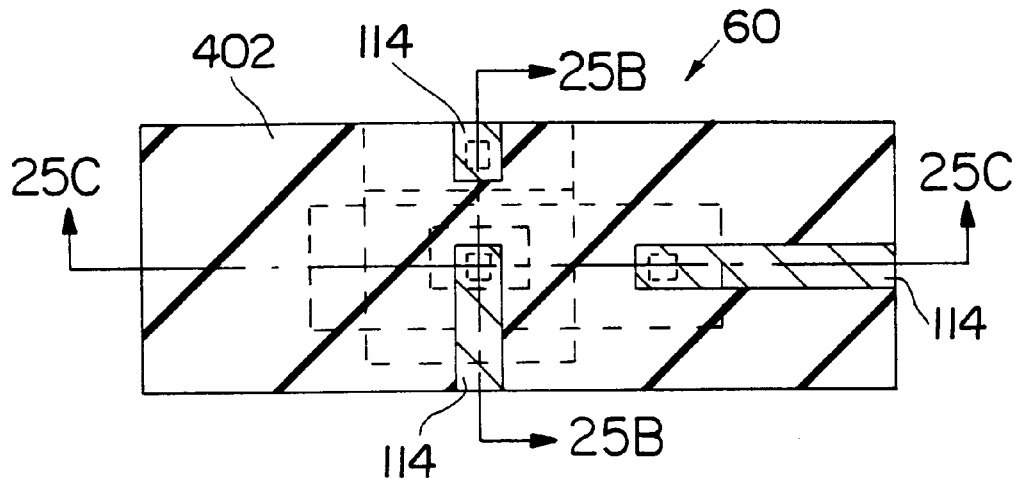
FIG. 25A is a top view of a resonance tunnel diode in a sixth example according to the present invention.
Figure 25B:
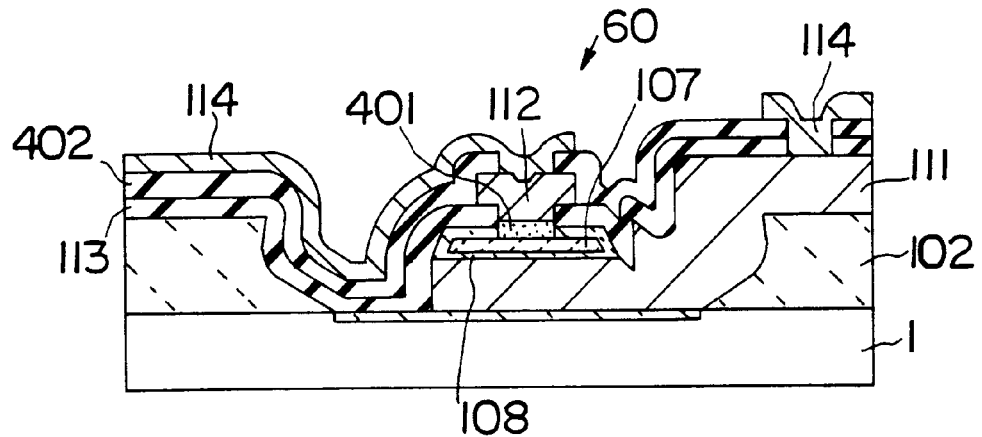
FIG. 25B is a cross sectional view of the resonance tunnel diode shown in FIG. 25A taken along line 25B—25B in FIG. 25A.
Figure 25C:
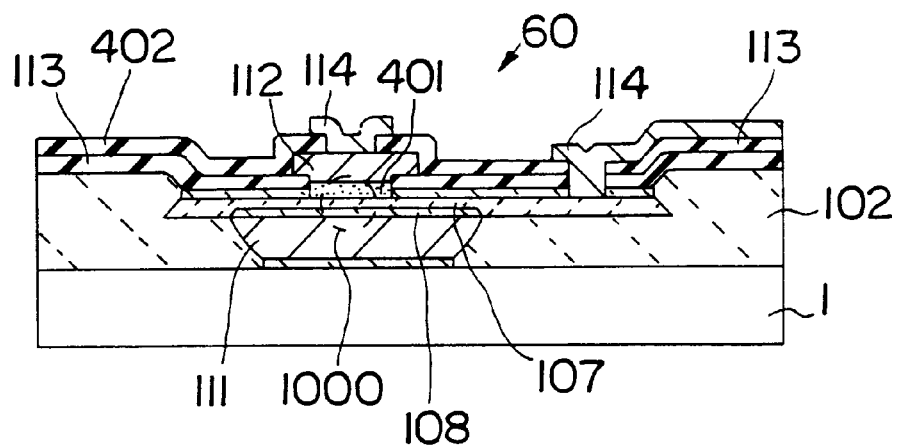
FIG. 25C is a cross sectional view of the resonance tunnel diode shown in FIG. 25A taken along line 25C—25C in FIG. 25A.
Figure 26A:
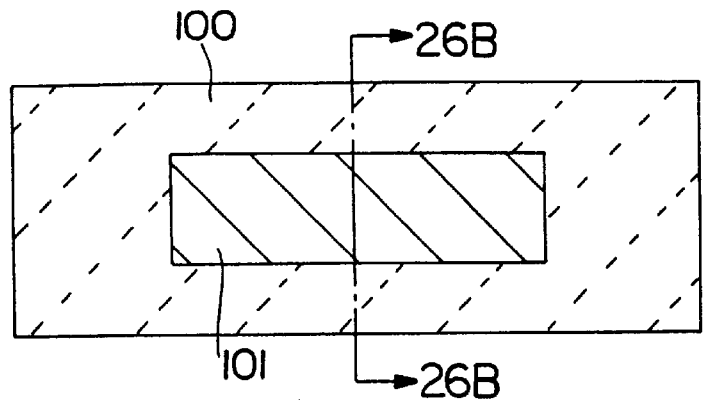
FIGS. 26A, 26C, 27A, 27C, 28A, 28C and 29A are top views illustrating a method for producing the resonance tunnel diode shown in FIG. 25A.
Figure 26B:
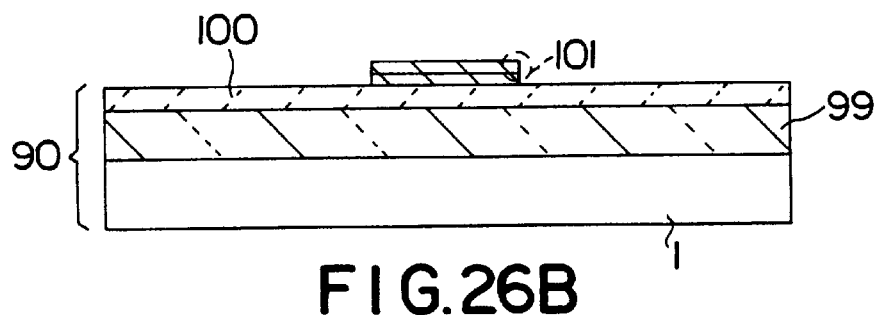
FIGS. 26B, 26D, 27B, 27D, 28B, 28D and 29B are cross sectional views taken along lines X–X' in FIGS. 26A, 26C, 27A, 27C, 28A, 28C and 29A, respectively.
Figure 26C:
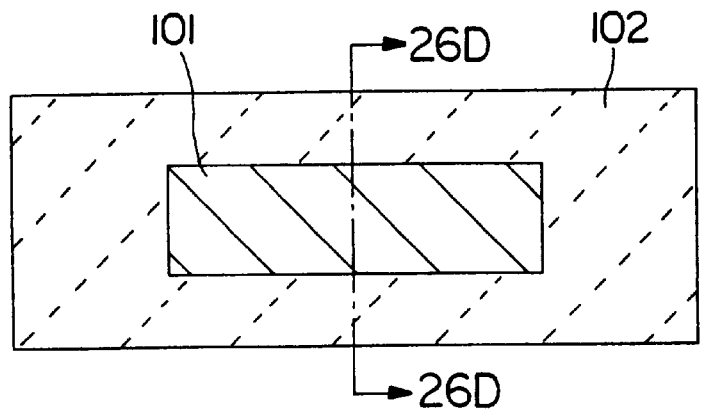
Figure 26D:
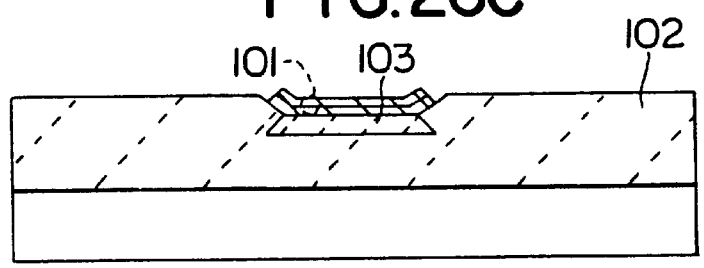

FIG. 25A is a top view of the resonance tunnel diode 60 in the sixth example, FIG. 25B is a cross sectional view of the resonance tunnel diode 60 taken along line 25B—25B in FIG. 25A, and FIG. 25C is a cross sectional view of the resonance tunnel diode 60 taken along line 25C—25C in FIG. 25A. FIGS. 26A through 26D, 27A through 27D, and 28A through 28D, and 29A and 29B illustrate a method for producing the resonance tunnel diode 60. FIGS. 26A, 26C, 27A, 27C, 28A, 28C, and 29A are top views, and FIGS. 26B, 26D, 27B, 27D, 28B, 28D, and 29B are cross sectional views taken along lines X–X' in FIGS. 26A, 26C, 27A, 27C, 28A, 28C, and 29A, respectively. Identical elements discussed in the first example will bear identical reference numerals therewith and the descriptions thereof will be omitted.

The resonance tunnel diode 60 in the sixth example is different from the resonance tunnel diode 10 in the first example in the following point. In the resonance tunnel diode 60, the tunneling barriers provided on top and bottom surfaces of the silicon thin layer 107 as a quantum well are formed of different materials. The tunneling barrier on the bottom surface of the silicon thin layer 107 is the silicon oxide layer 108, whereas the tunneling barrier 401 on the top surface of the silicon thin layer 107 is formed of CaF$_2$ (calcium fluoride) or the like.

When the height of the tunneling barrier which receives electrons is changed, the intensity and the half width of the peak current can be changed. For example, when a CaF$_2$ layer having a potential height of about 1 eV is used instead of the silicon oxide layer having a potential height of about 3.1 eV, the half width of the peak current is broadened, but the intensity of the peak current is increased. The resonance tunnel diode 60 having such a characteristic can be used in a part of an IC device where an extremely high speed is demanded so that the resultant IC device can operate at a high speed.

With reference to FIGS. 26A through 26D, 27A through 27D, 28A through 28D, 29A and 29B, a method for producing the resonance tunnel diode 60 will be described.

Figure 27A:
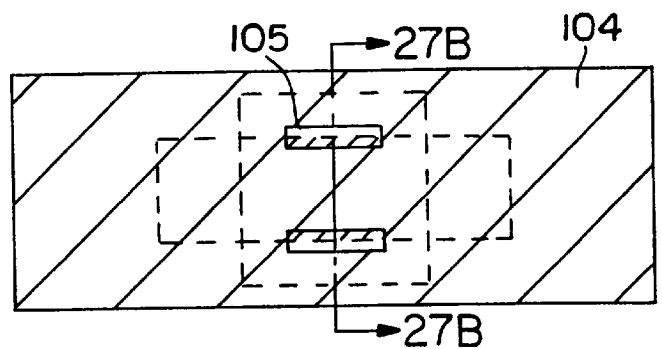
Figure 27B:
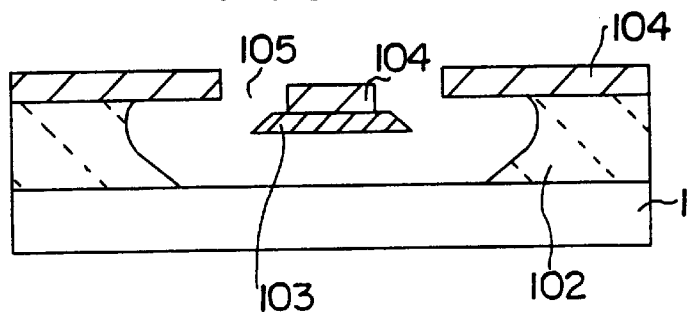
Figure 27C:
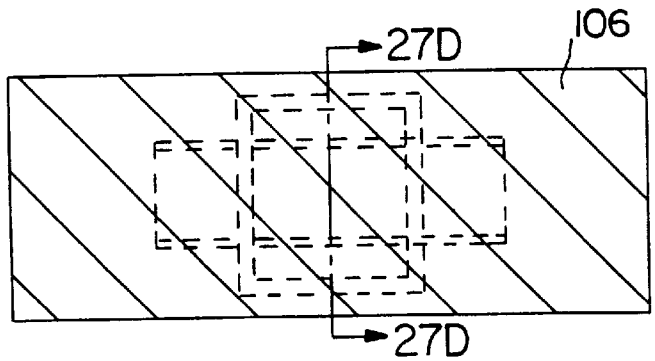
Figure 27D:
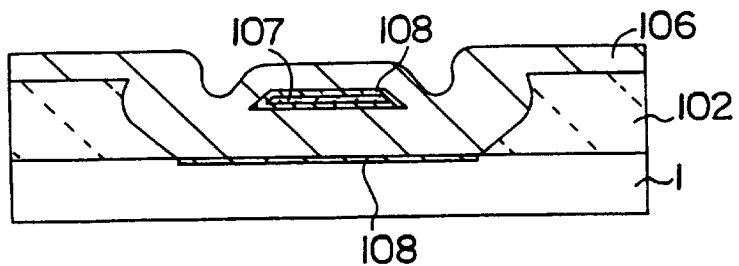

The method in the sixth example is the same as that in the first example until the polycrystalline silicon layer 106 is formed as shown in FIGS. 27C and 27D (and FIGS. 3C and 3D), and the description thereof will be omitted.

Figure 28A:
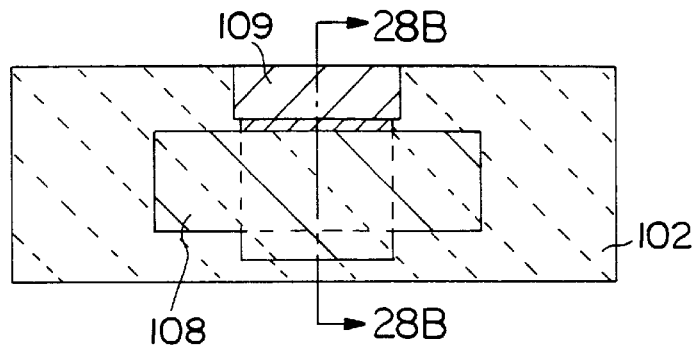

After the polycrystalline silicon layer 106 is formed, phosphorus is implanted into the polycrystalline silicon layer 106 at a concentration of about $1\times10^{19}$ cm$^{-3}$ by high concentration phosphorus diffusion performed at a temperature of about 900° C. for about 20 minutes using POCl$_3$ gas. Then, as shown in FIG. 28A, a second resist layer 109 is formed on the resistant body by photolithography and patterning. The resultant body is treated by dry etching performed using SiCl$_{41}$ CH$_2$F$_2$, SF$_6$ and O$_2$ gases. Thus, as shown in FIG. 28B, the first electrode 111 is formed.

Figure 28B:
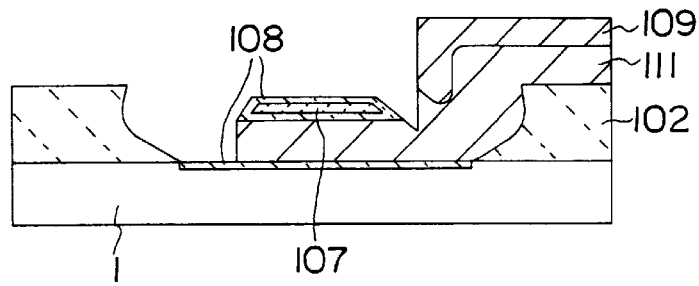

Since the second resist layer 109 is not patterned to remain on the silicon thin layer 107, which is different from the first example, the polycrystalline silicon layer 106 is completely removed from the top of the silicon thin layer 107 to expose the silicon oxide layer 108 (FIG. 28B).

Figure 28C:
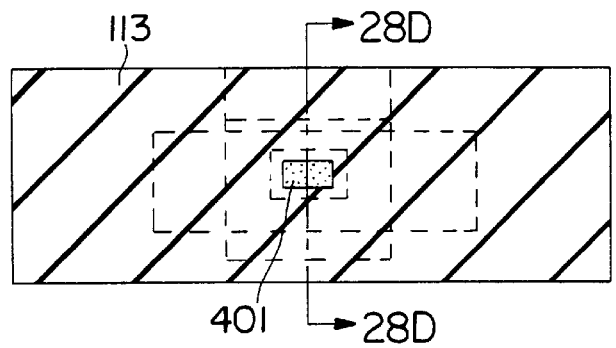
Figure 28D:
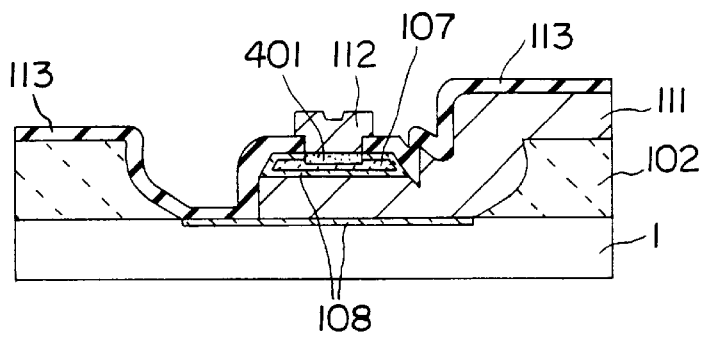

As shown in FIGS. 28C and 28D, the second resist layer 109 is removed and a first inter-level insulation layer 113 is deposited on the resultant body to a thickness of about 200 nm by LPCVD. Then, a mask pattern having a square opening of about 1 $\mu$m×about 1 $\mu$m in positional correspondence with a central area of the silicon thin layer 107 is formed on the first interlevel insulation layer 113 by photolithography. The resultant body is treated by dry etching performed using CF$_4$ gas and O$_2$ gas to expose the central area of the silicon thin layer 107. A CaF$_2$ layer is deposited to a thickness of about 1.5 nm by MBE to form another tunneling barrier 401 on the silicon thin layer 107.

Then, a polycrystalline silicon layer is deposited by LPCVD to a thickness of about 150 nm and phosphorus is implanted therein at the concentration of about $1\times10^{19}$cm$^{-3}$ or more. The polycrystalline silicon layer is patterned by photolithography and dry etching to form the second electrode 112 on the second tunneling barrier 401 directly above the silicon thin layer 107 (FIG. 28D). According to the fabricating process of this example, the impurity concentration in the first electrode 111 may be different from that in the second electrode 112 so that the Fermi level of the first electrode 111 is different from that in the second electrode 112.

Figure 29A:
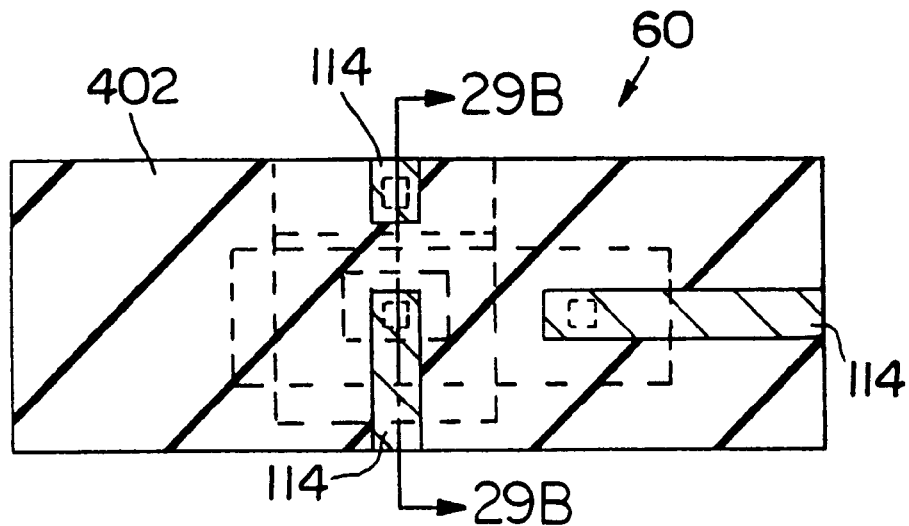
Figure 29B:
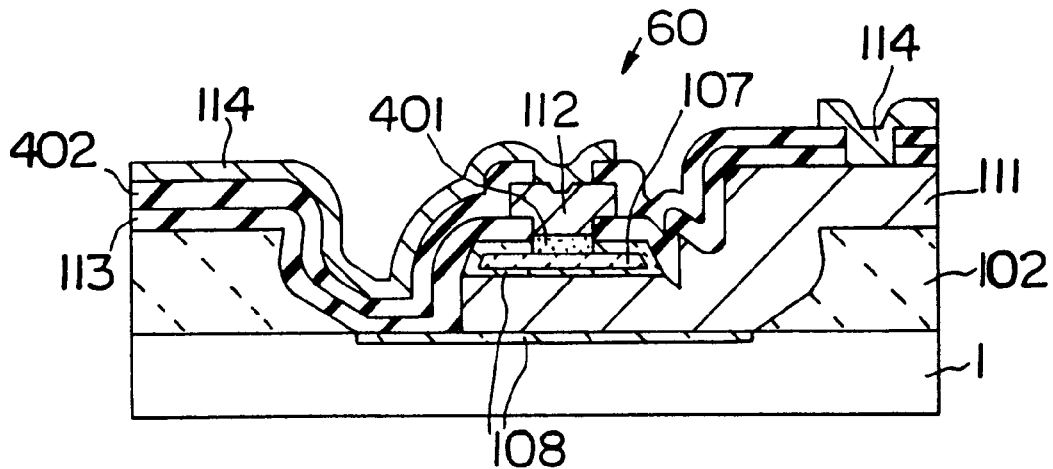

Then, as shown in FIGS. 29A and 29B, a second inter-level insulation layer 402 is deposited to a thickness of about 200 nm by LPCVD, and a mask pattern having openings in positional correspondence with the first and second electrodes 111 and 112 is formed on the second inter-level insulation layer 402. After the inter-level insulation layer 402 is etched by $CF_4$ gas $O_2$ gas in accordance with the openings, aluminum is deposited to a thickness of about 1 $\mu$m by sputtering and patterned to form third electrodes 114, as shown in FIGS. 29A and 29B.

The steps thereafter for producing the resonance tunnel diode 60 are the same as those in the first example, and the description thereof will be omitted.

The resonance tunnel diode 60 has the double-barrier structure 1000 of tunneling barrier (silicon oxide layer 108)/quantum well (silicon thin layer 107)/tunneling barrier 401. The resonance tunnel diode 60 further includes the first and second electrodes 111 and 112, and the third electrodes 114 for controlling the potential of the quantum well.

The silicon oxide layers 108, each acting as a tunneling barrier, may be formed via CVD or ozone oxidation instead of thermal oxidation. Each tunneling barrier may be a nitride layer formed by thermal nitrification in a nitride atmosphere or ny CVD, a nitrogen oxide layer, or an SiGe, $CaF_2$ or SiC layer formed by crystal growth.

The silicon substrate 1 may have any surface orientation which can form an SOI substrate, as well as the (001) surface orientation.

The silicon layer 100 may be of a p-type conductivity, in which case, the first and second electrodes 111 and 112 are formed of polycrystalline silicon containing p-type impurities diffused therein.

The third electrodes 114 may be formed of another type of metal instead of aluminum.

Instead of forming the second electrode 112 of polycrystalline silicon, the third electrode 114 may be formed in direct contact with the second tunneling barrier 401 without forming the second electrode 112.

Instead of forming a silicon island 103 which is completely isolated by partially oxidizing the silicon layer 100, the silicon island 103 may be isolated by performing dry etching of the silicon layer 100 using the multi-film layer 101 including the pad oxide layer/nitride layer as a mask. In such a case, the silicon island is mesa-shaped.

In the first through fifth examples previously explained, the tunneling barriers on the top and bottom surfaces of the silicon thin layer 107 can be formed of different materials using the method in the sixth example.

EXAMPLE 7

A resonance tunnel diode 70 in a seventh example according to the present invention will be described with reference to FIGS. 30A through 33D.

Figure 30A:
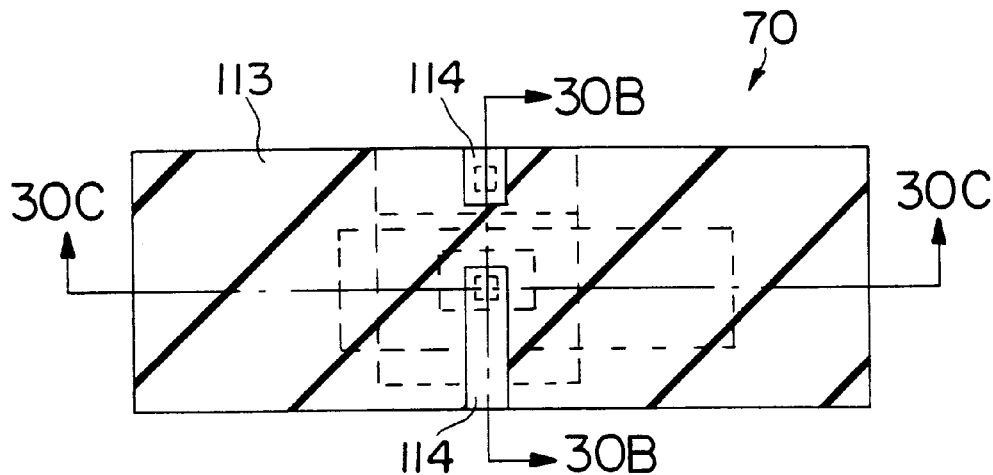
FIG. 30A is a top view of a resonance tunnel diode in a seventh example according to the present invention.
Figure 30B:
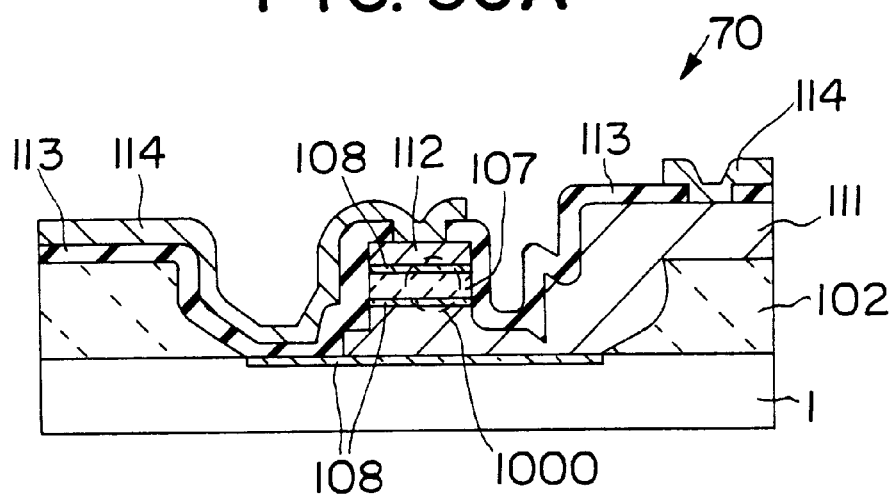
FIG. 30B is a cross sectional view of the resonance tunnel diode shown in FIG. 30A taken along line 30B—30B in FIG. 30A.
Figure 30C:
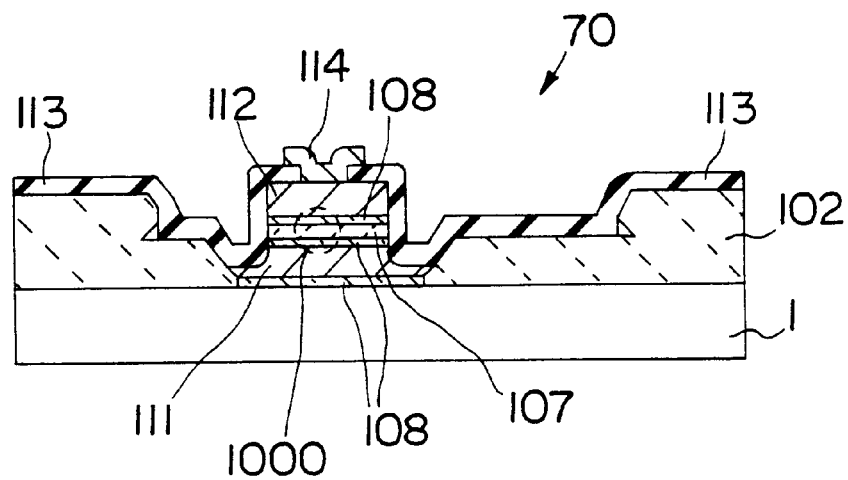
FIG. 30C is a cross sectional view of the resonance tunnel diode shown in FIG. 30A taken along line 30C—30C in FIG. 30A.
Figure 32A:
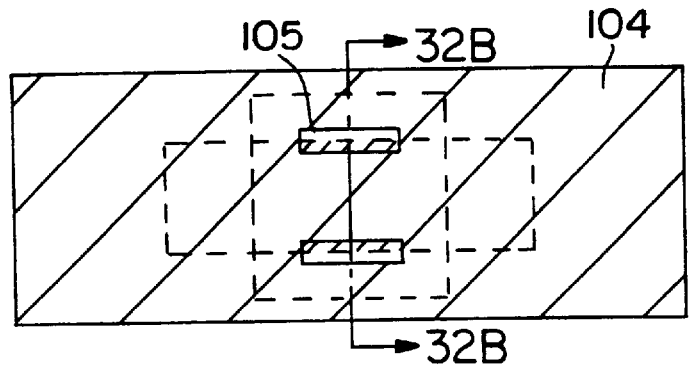
Figure 32B:
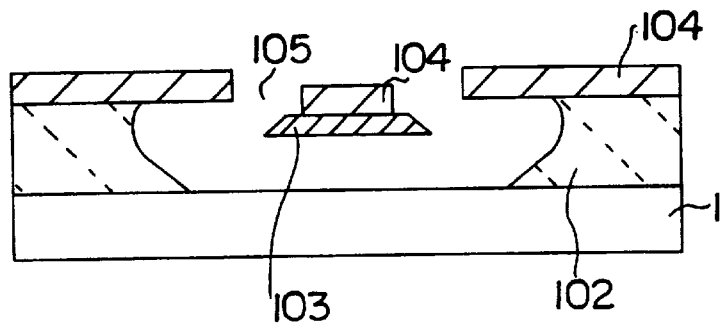
Figure 32C:
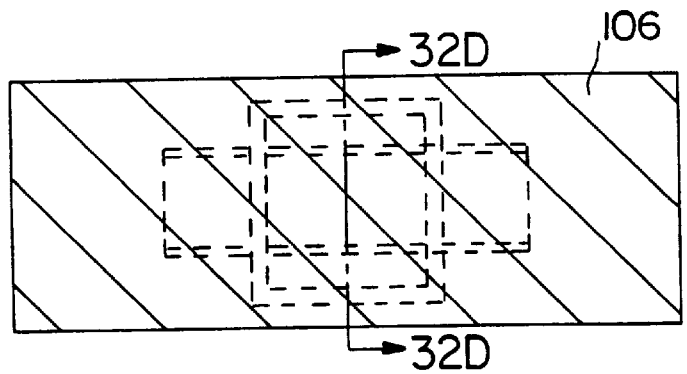
Figure 32D:
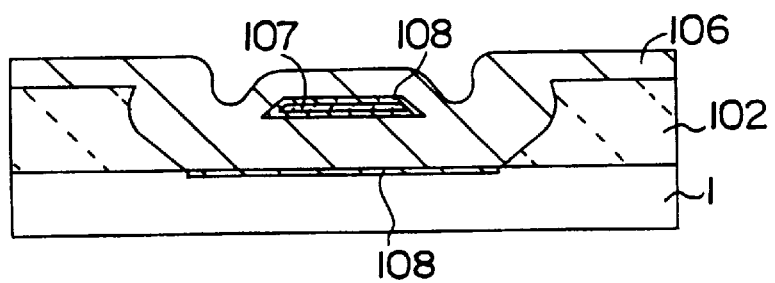

FIG. 30A is a top view of the resonance tunnel diode 70 in the seventh example, FIG. 30B is a cross sectional view of the resonance tunnel diode 70 taken along line 30B—30B in FIG. 30A, and FIG. 30C is a cross sectional view of the resonance tunnel diode 70 taken along line 30C—30C in FIG. 30A. FIGS. 31A through 31D, 32A through 32D, and 33A through 33D illustrate a method for producing the resonance tunnel diode 70. FIGS. 31A, 31C, 32A, 32C, 33A, and 33C are top views, and FIGS. 31B, 31D, 32B, 32D, 33B, and 33D are cross sectional views taken along lines X–X' in FIGS. 31A, 31C, 32A, 32C, 33A, and 33C, respectively. Identical elements discussed in the first example will bear identical reference numerals therewith and the descriptions thereof will be omitted.

The resonance tunnel diode 70 in the seventh example is different from the resonance tunnel diode 10 in the first example in the following point. In the resonance tunnel diode 70, the double-barrier structure 1000 including the silicon thin layer 107 and the silicon oxide layers 108 is formed in a mesa-shape and the double-barrier structure 1000 is surrounded by the inter-level insulating film 113 such as a silicon oxide film. As a result of such a structure, a leakage current path is significantly limited and the valley current is sufficiently decreased to obtain a sufficiently high peak/valley ratio. In addition, use of the mesa-structure enables mechanical stress applied to the double-barrier structure 1000 to be reduced.

With reference to FIGS. 31A through 31D, 32A through 32D, and 33A through 33D, a method for producing the resonance tunnel diode 70 will be described.

Figure 33A:
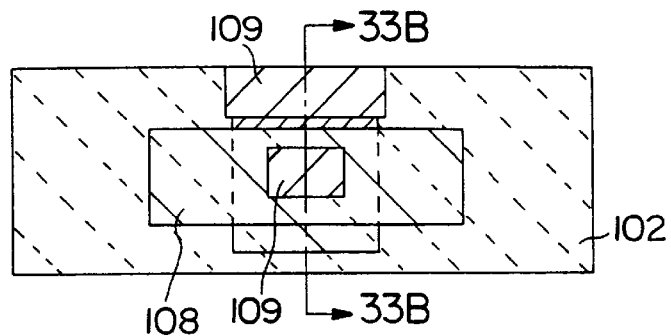
Figure 33B:
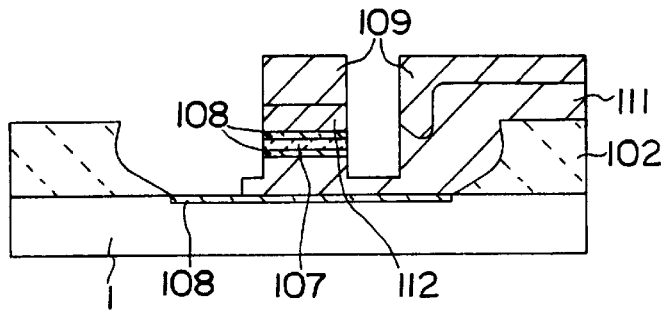

The method in the seventh example is the same as that in the first example until the first and second electrodes 111 and 112 are formed as shown in FIGS. 33A and 33B (and FIGS. 4A and 4B), and the description thereof will be omitted.

In the dry etching process to form the first and second electrodes 111 and 112 shown in FIGS. 33A and 33B, the etching continues until the silicon thin layer 107 and the silicon oxide film 108 provided on the bottom surface of the silicon thin layer 107 are removed, whereas the etching is stopped when the silicon oxide film 108 on the top surface of the silicon thin layer 107 is exposed in the first example. As a result, the double-barrier structure 1000 is formed to have a mesa-shaped cross-section.

Figure 33C:
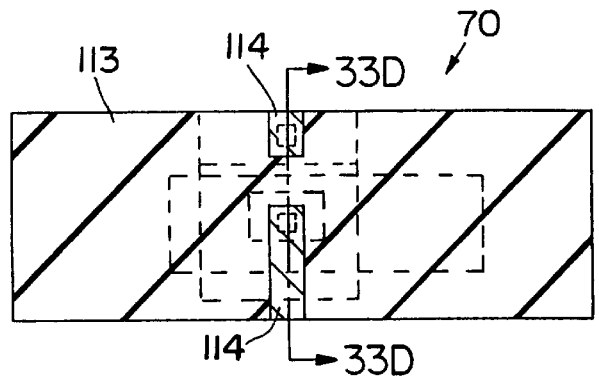
Figure 33D:
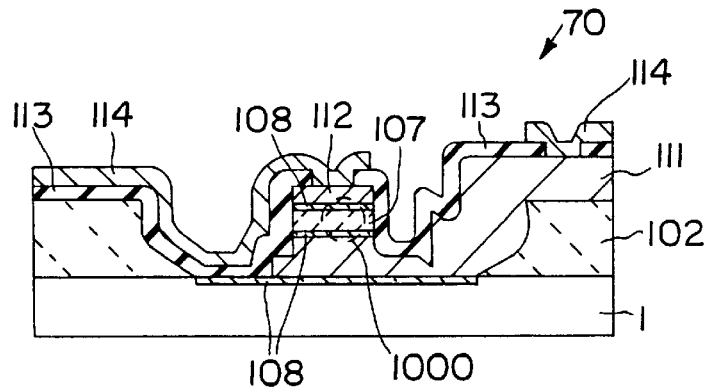

Then, the same process as described in the first example with reference to FIGS. 4C and 4D is performed as illustrated in FIGS. 33C and 33D, resulting in the completion of the resonance tunnel diode 70.

The resonance tunnel diode 70 has the double-barrier structure 1000 of tunneling barrier (silicon oxide layer 108)/quantum well (silicon thin layer 107)/tunneling barrier (silicon oxide layer 108). The resonance tunnel diode 70 further includes the first and second electrodes 111 and 112, and the third electrodes 114 for controlling the potential of the quantum well.

The silicon oxide layers 108, each acting as a tunneling barrier, may be formed via CVD or ozone oxidation instead of thermal oxidation. Each tunneling barrier may be a nitride layer formed by thermal nitrification in a nitride atmosphere or by CVD, a nitrogen oxide layer, or an SiGe, $CaF_2$ or SiC layer formed by crystal growth.

The silicon substrate may have any surface orientation which can form an SOI substrate, as well as the (001) surface orientation.

The silicon layer 100 may be of a p-type conductivity, in which case, the first a nd second electrodes 111 and 112 are formed of polycrystalline silicon containing p-type impurities diffused therein.

The third electrodes 114 may be formed of another type of metal instead of aluminum.

Instead of forming a silicon island 103 which is completely isolated by partially oxidizing the silicon layer 100, the silicon island 103 may be isolated by performing dry etching of the silicon layer 100 using the multi-film layer 101 including the pad oxide layer/nitride layer as a mask. In such a case, the silicon island is mesa-shaped.

As in the sixth example, the tunneling barriers on the top and bottom surfaces of the silicon thin layer 107 may be formed of different materials.

EXAMPLE 8

Figure 34A:
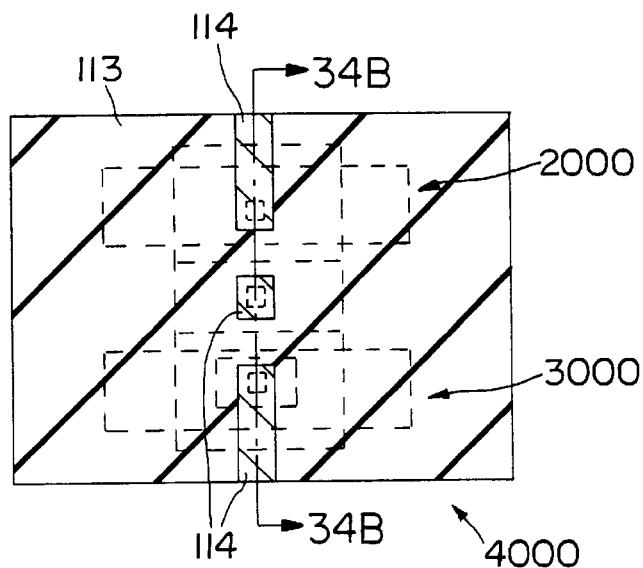
FIG. 34A is a top view of a memory in an eighth example according to the present invention.

A memory 4000 including a resonance tunnel diode according to the present invention will be described in an eighth example with reference to FIGS. 34A, 34B and 35. FIG. 34A is a top view of the memory 4000, and FIG. 34B is a cross sectional view of the memory 4000 taken along line 34B—34B in FIG. 34A.

Figure 34B:
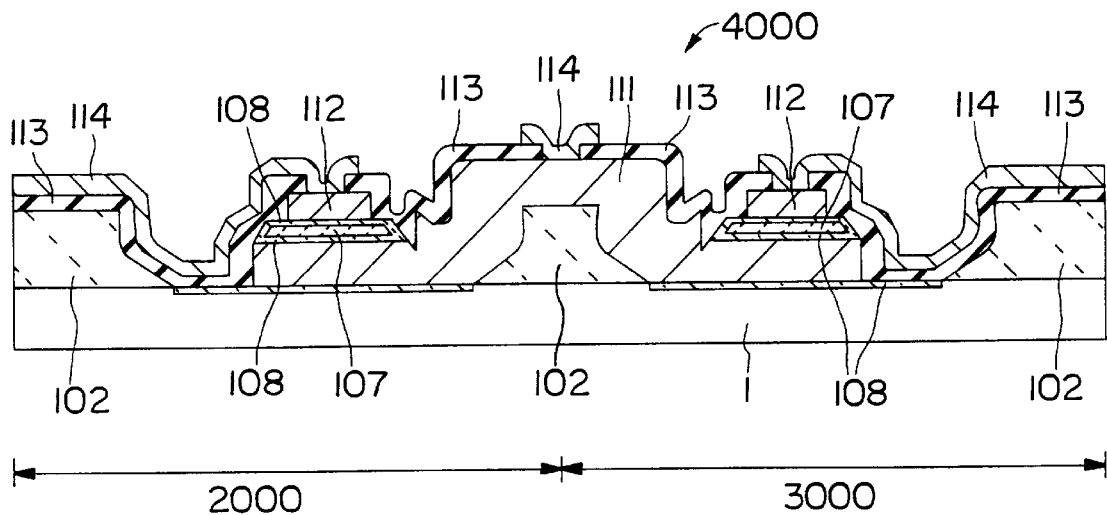
FIG. 34B is a cross sectional view of the memory shown in FIG. 34A taken along line 34B—34B in FIG. 34A.

As shown in FIG. 34B, the memory 4000 includes first and second resonance tunnel diodes 2000 and 3000. The two resonance tunnel diodes 2000 and 3000, each having the structure as described in the first example as the resonance tunnel diode 10, are insulated from each other by the field oxide layer 102 and connected in series by first electrodes 111 thereof. The memory 4000 includes three third electrodes 114, which-respectively act as a ground (GND) terminal, a power supply (Vdd) terminal, and an voltage application (Vd) terminal.

The operation of the memory 4000 shown in FIGS. 34A and 34B will be described with reference to FIG. 35. FIG. 35 is a graph illustrating the I–V characteristic of the memory 4000. The I–V characteristic shown in FIG. 35 represents the relationship between the voltage (V) applied between the third electrode 114 acting as the Vd terminal and the third electrode 114 acting as the GND terminal, and the current (I) flowing through the memory 4000.

Figure 35:
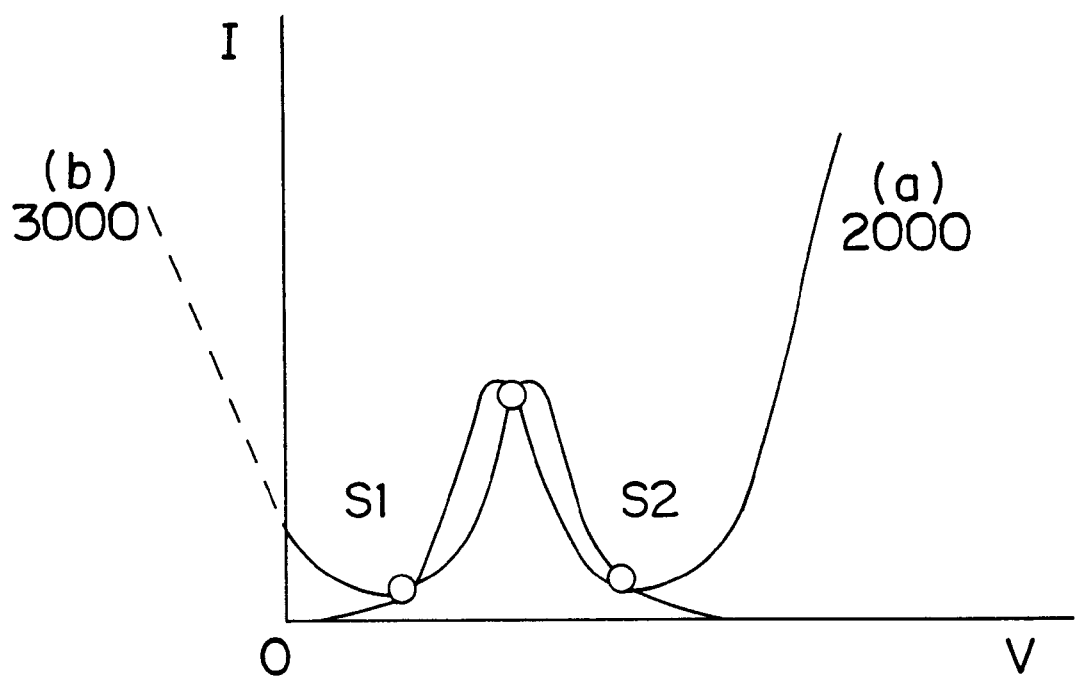
FIG. 35 is a graph illustrating the I–V characteristics of the memory shown in FIG. 34A.

In FIG. 35, the I–V characteristic (a) is the characteristic of the single resonance tunnel diode 2000. On the other hand, since the second resonance tunnel di ode 3000 functions as a load, its I–V characteristic (b), i.e., the load curve, is an inverse curve of the I–V characteristic (a) of the single resonance tunnel diode 3000. The two I–V curves (a) and (b) cross each other at three points as shown in FIG. 35, but the memory 4000 is stable only at two points S1 and S2 because of the theorem of minimum entropy generation. The memory 4000 is unstable at the middle cross point. When a voltage which is even slightly lower than the voltage corresponding to the middle cross point is applied, the memory 4000 becomes stable in the state of point S1; and when a voltage which is even slightly higher than the voltage corresponding to the middle cross point is applied, the memory 4000 becomes stable in the state of point S2.

In this manner, the memory 4000 functions as a bi-stable memory.

In this example, two resonance tunnel diodes 10 in the first example are used as the resonance tunnel diodes 2000 and 3000, but resonance tunnel diodes in any other example according to the present invention may be used in the memory 4000.

EXAMPLE 9

Figure 36A:
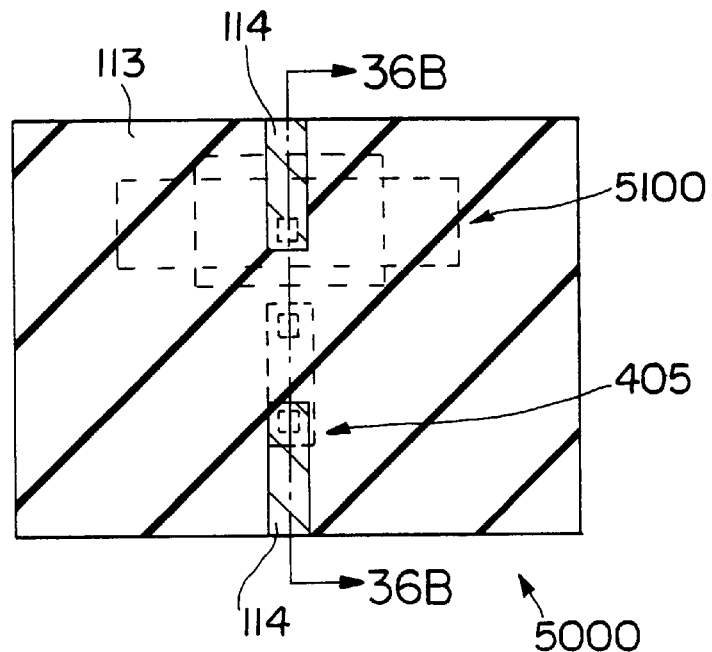
FIG. 36A is a top view of a memory in a ninth example according to the present invention.

A memory 5000 including a resonance tunnel diode according to the present invention will be described in a ninth example with reference to FIGS. 36A, 36B and 37. FIG. 36A is a top view of the memory 5000, and FIG. 36B is a cross sectional view of the memory 5000 taken along line 36—36B in FIG. 36A.

Figure 36B:
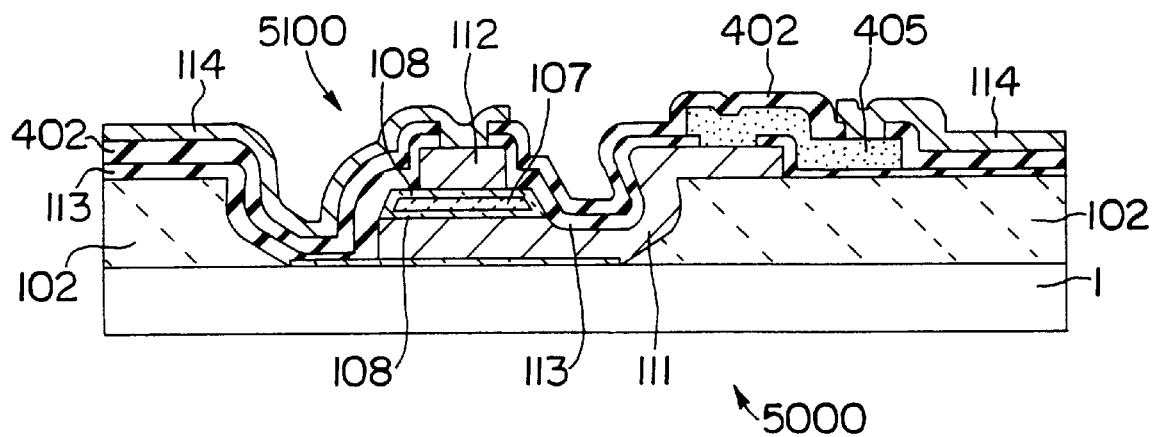
FIG. 36B is a cross sectional view of the memory shown in FIG. 36A taken along line 36B—36B in FIG. 36A.

As shown in FIG. 36B, the memory 5000 includes a resonance tunnel diode 5100 and a polycrystalline silicon layer 405 for providing a load resistance. The polycrystalline silicon layer 405 is connected in series to the first electrode 111 of the resonance tunnel diode 5100 through an inter-level insulation layer 113. The resonance tunnel diode 5100 has the structure as described in the first example as the resonance tunnel diode 10.

FIG. 37 is a graph illustrating the I–V characteristic (a) of the resonance tunnel diode 5100 and the I–V characteristic (b) of the polycrystalline silicon layer 405 obtained by measuring a current I flowing in the memory 5000 when a voltage is applied between the two third electrodes 114 in the memory 5000.

Since the resonance tunnel diode 5100 exhibits a negative resistant characteristic and the polycrystalline silicon layer 405 acts as a load resistor, the I–V curves (a) and (b) of the resonance tunnel diode 5100 and the polycrystalline silicon layer 405 cross each other at three points, as illustrated in FIG. 37. However, as in the memory 4000 in the previous example, the memory 5000 is stable at two points S1 and S2, and therefore functions as a bi-stable memory.

As the resistance of the polycrystalline silicon layer 405 increases, the gradient of the I–V characteristic (b) thereof decreases, and thus the distance between points S1 and S2 increases. In this example, the resistance can be controlled by changing the dose of the impurities such as phosphorus atoms implanted into the polycrystalline silicon layer 405, resulting in the setting of the operational characteristics of the memory 5000 in a desired manner.

In this example, the resonance tunnel diode 10 in the first example is used as the resonance tunnel diode 5100, but a resonance tunnel diode in any other example according to the present invention may be used in the memory 5000.

EXAMPLE 10

Figure 38A:
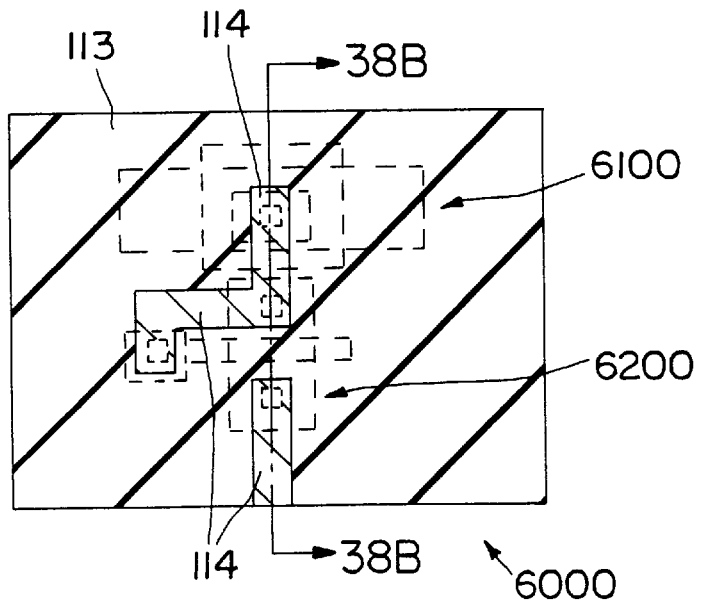
FIG. 38A is a top view of a memory in a tenth example according to the present invention.

A memory 6000 including a resonance tunnel diode according to the present invention will be described in a tenth example with reference to FIGS. 38A, 38B and 39. FIG. 38A is a top view of the memory 6000, and FIG. 38B is a cross sectional view of the memory 6000 taken along line 38B—38B in FIG. 38A.

Figure 38B:
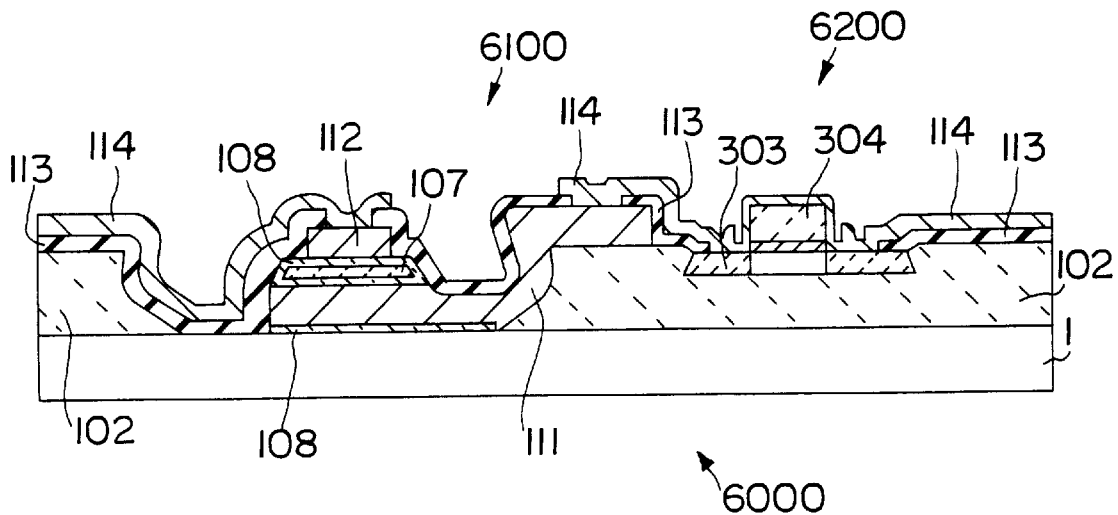
FIG. 38B is a cross sectional view of the memory shown in FIG. 38A taken along line 38B—38B in FIG. 38A.

As shown in FIG. 38B, the memory 6000 includes a resonance tunnel diode 6100 and a normally-on depletion MOSFET 6200. The normally-on depletion MOSFET 6200 is connected in series to the first electrode 111 of the resonance tunnel diode 6100 through an inter-level insulation layer 113. As shown in FIG. 38A, a source 303 and a gate 304 of the MOSFET 6200 on the side of the first electrode 111 are short-circuited, so that the MOSFET 6200 operates in the normally-on state. The resonance tunnel diode 6100 has the structure as described in the first example as the resonance tunnel diode 10.

Figure 39:
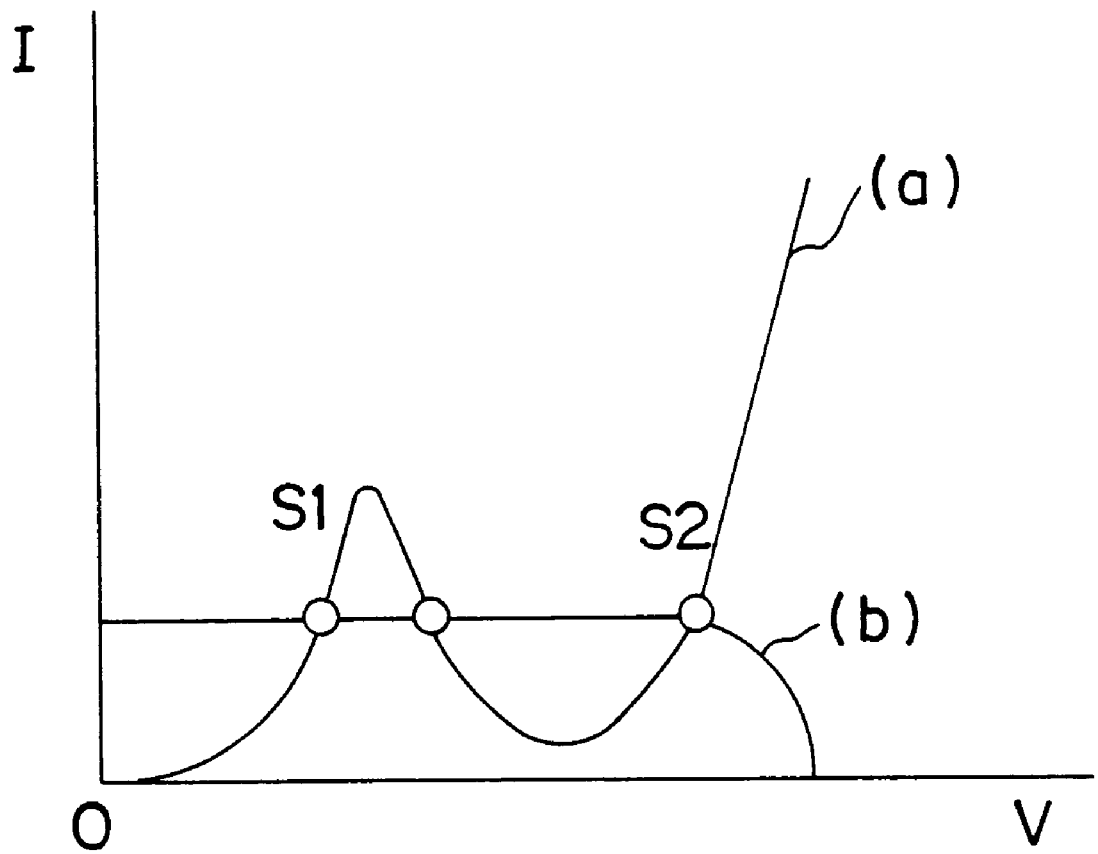
FIG. 39 is a graph illustrating the I–V characteristics of the memory shown in FIG. 38A.
Figure 40A:
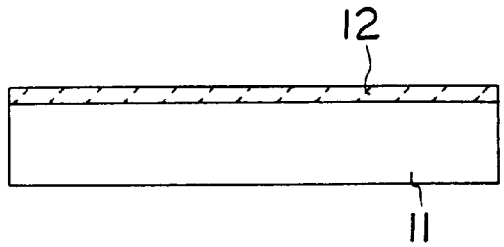
FIGS. 40A through 40D are cross sectional views illustrating a method for producing a conventional resonance tunnel diode using compound semiconductor materials.
Figure 40B:
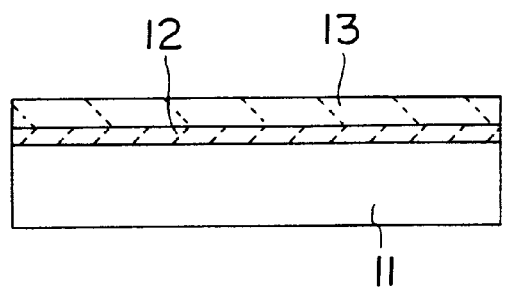
Figure 40C:
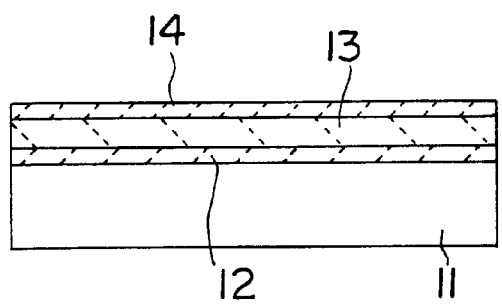
Figure 40D:
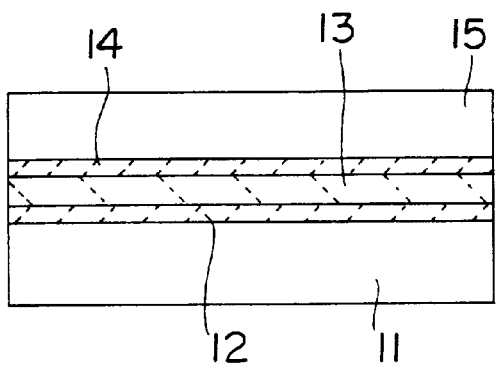
Figure 41A:
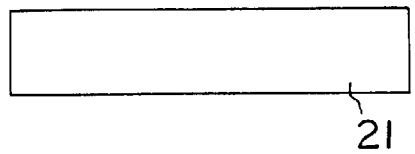
FIGS. 41A through 41E are cross sectional views illustrating a method for producing a conventional resonance tunnel diode using silicon materials.
Figure 41B:
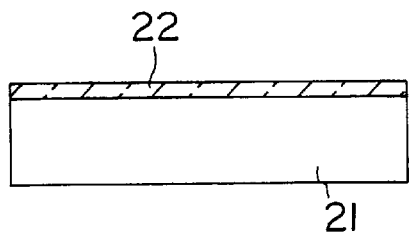
Figure 41C:
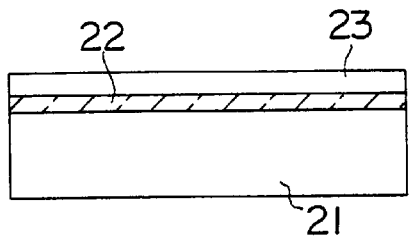
Figure 41D:
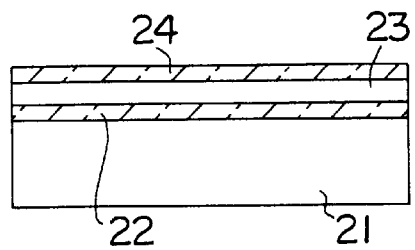
Figure 41E:
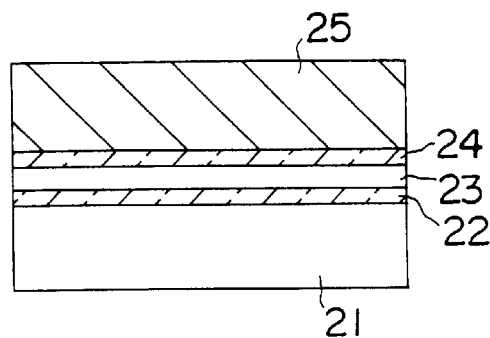

FIG. 39 is a graph illustrating the I–V characteristic (a) of the resonance tunnel diode 6100 and the I–V characteristic (b) of the depletion-type MOSFET 6200 obtained by measuring a current I flowing in the memory 6000 when a voltage is applied between the two third electrodes 114 in the memory 6000.

Since the resonance tunnel diode 6100 exhibits a negative resistant characteristic and the depletion-type MOSFET 6200 acts as a resistive load, the I–V curves (a) and (b) of the resonance tunnel diode 6100 and the MOSFET 6200 cross each other at three points, as illustrated in FIG. 39. However, as in the memory 4000 in the previous example, the memory 6000 is stable at two points S1 and S2, and therefore functions as a bi-stable memory.

Since the resonance tunnel diode 6100 and the MOSFET 6200 are provided on the same substrate, a CMOS circuit can be used for reading signals from the memory 6000 although not shown.

In this example, the resonance tunnel diode 10 in the first example is used as the resonance tunnel diode 6100, but a resonance tunnel diode in any other example according to the present invention may be used in the memory 6000.

Instead of the depletion MOSFET 6200 in which the source and gate are short-circuited, an enhancement MOSFET in which the drain and gate are short-circuited can be used.

As described above, in a quantization functional device according to the present invention, the layer acting as a quantum well is a top silicon layer of the SOI substrate. Accordingly, the crystallinity of the quantum well is approximately as high as that of the silicon substrate. Furthermore, since satisfactory tunneling barriers can be formed of silicon oxide layers or the like, the height of the potential barriers is as high as 3.1 eV. Moreover, the interface between the quantum well and the tunneling barrier is flat so that its unevenness is negligible even at the atomic level.

In a quantization functional device according to the present invention having these advantages, an extremely sharp quantization level can be formed in the quantum well, and thus a satisfactory resonance tunneling effect of electrons can be obtained. The quantization functional device according to the present invention having these advantages therefore exhibits excellent operational characteristics.

By a method for producing a quantization functional device according to the present invention, a quantization functional device can be produced using silicon materials, which are generally used in the field of semiconductor processing, and using semiconductor production technologies used in general, such as thermal oxidation. The thickness of the quantum well, which is significantly responsible for the characteristics of the quantization functional device, is controlled during the process of thermal oxidation, which provides highly precise controllability. Accordingly, a silicon layer having a thickness of as microscopic as several nanometers can be formed uniformly on the entire wafer. A quantum well having the thickness controlled in such a precise manner contributes to satisfactorily high performance and high producibility.

Furthermore, an integrated circuit including one or more quantization functional devices and another semiconductor device such as a MOSFET or the like formed on the same substrate can be produced relatively easily.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a quantization functional device, comprising the steps of:
   forming a silicon island on a silicon-on-insulator substrate including a silicon substrate, a buried insulating layer and an upper silicon layer;
   forming a silicon thin layer having a first surface and a second surface and having a thickness sufficiently thin to function as a quantum well;
   forming a pair of tunnel barriers respectively on the first and second surfaces of the silicon thin layer; and
   forming a first electrode and a second electrode operatively coupled to each other and interposing the silicon thin layer and the pair of tunnel barriers therebetween.

2. A method for fabricating a quantization functional device, according to claim 1,
   wherein the step of forming a silicon thin layer includes the steps of:
   removing a portion of the buried insulating layer located directly below the silicon island to form the silicon island into the silicon thin layer; and
   processing at least a portion of the silicon thin layer into a free-standing structure.

3. A method for fabricating a quantization functional device, according to claim 1,
   wherein the step of forming a silicon thin layer includes the steps of:
   removing a portion of the buried insulating layer located directly below the silicon island to process at least a portion of the silicon island into a free-standing structure; and
   processing at least a portion of the free-standing structure into the silicon thin layer.

4. A method for fabricating a quantization functional device, according to claim 1,
   wherein the step of forming first and second electrodes includes the steps of:
   depositing a polysilicon layer on a surface of the silicon-on-insulator substrate;
   doping, at a high concentration, the polysilicon layer with an impurity having the same conductivity type as the upper silicon layer; and
   patterning the polysilicon layer to form the first and second electrodes.

5. A method for fabricating a quantization functional device, according to claim 1,
   wherein the step of forming a silicon thin layer includes the steps of:
   removing a portion of the buried insulating layer located directly below the silicon island to process at least a portion of the silicon island into a free-standing structure, and
   wherein the step of forming first and second electrodes includes the steps of:
   exposing a portion of the silicon substrate at a position directly below the free-standing structure;
   performing lateral epitaxial crystal growth by using the exposed portion of the silicon substrate as a seed to form a single crystalline silicon film;
   doping the single crystalline silicon film with an impurity having the same conductivity type as the upper silicon layer; and
   patterning the single crystalline silicon layer to form the first and second electrodes.

6. A method for fabricating a quantization functional device, according to claim 1,
   wherein the step of forming a pair of tunnel barriers includes the steps of:
   forming a first tunnel barrier on the first surface of the silicon thin layer which is closer to the silicon-on-insulator substrate than the second surface of the silicon thin layer; and
   forming a second tunnel barrier on the second surface of the silicon thin layer which is opposite to the first surface thereof,
   and wherein the step of forming first and second electrodes includes the steps of:

depositing a first polysilicon layer on a surface of the silicon-on-insulator substrate;

doping, at a high concentration, the first polysilicon layer with an impurity having the same conductivity type as the upper silicon layer;

patterning the first polysilicon layer to form the first electrode on the first tunnel barrier;

forming a first insulating film on the surface of the silicon-on-insulator substrate;

forming an opening in the first insulating film at a position directly above the first electrode, thereby exposing a portion of the silicon thin layer through the opening;

depositing a second polysilicon layer on the surface of the silicon-on-insulator substrate;

doping, at a high concentration, the second polysilicon layer with an impurity having the same conductivity type as the upper silicon layer; and patterning the second polysilicon layer to form the second electrode on the second tunnel barrier formed on the exposed portion of the silicon thin layer.

7. A method for fabricating a quantization functional device according to claim 1, wherein the step of forming a silicon island includes the step of oxidizing at least a portion of the upper silicon layer of the silicon-on-insulator substrate, thereby forming a silicon oxide film, to form the silicon island which is separated by the buried insulating layer and the formed silicon oxide film.

8. A method for fabricating a quantization functional device according to claim 1, wherein the step of forming a silicon island includes the step of etching the upper silicon layer except for a portion in which the silicon island is to be formed.

9. A method for fabricating a quantization functional device according to claim 1, further comprising the step of forming a third electrode operatively coupled to the silicon thin layer.

10. A method for fabricating a quantization functional device according to claim 9, wherein the step of forming a third electrode includes the steps of:

forming an insulating layer to cover the first and second electrodes; and depositing a conductive layer on the insulating layer, and patterning the deposited layer to form the third electrode.

11. A method for fabricating a quantization functional device according to claim 9, wherein the step of forming a third electrode includes the steps of:

thermally oxidizing the silicon-on-insulator substrate;

forming an insulating layer to cover the first and second electrodes; and depositing a conductive layer on the insulating layer, and patterning the deposited layer to form the third electrode.

12. A method for fabricating a quantization functional device according to claim 1, further comprising, after the step of forming first and second electrodes, the steps of:

introducing an impurity having the same conductivity type as the upper silicon layer into the silicon thin layer in a self-aligning manner by using the second electrode as a mask; and performing a thermal treatment for activating the introduced impurity.

13. A method for fabricating a quantization functional device according to claim 1, wherein the step of forming a pair of tunnel barriers uses a process selected from a group consisting of a thermal oxidizing process, a plasma oxidizing process, a thermal nitriding process, a chemical vapor deposition process of a silicon oxide film, a chemical vapor deposition process of a silicon nitride film, a chemical vapor deposition process of a silicon oxynitride film, a crystal growth process of an SiC film, a molecular beam epitaxy process of a $CaF_2$ film, and a crystal growth process of an SiGe film.

14. A method for fabricating a quantization functional device according to claim 1, wherein in the step of forming a silicon thin layer, the thickness of the silicon thin layer is set within a range between about 0.3 nm and about 100 nm.

15. A method for fabricating a quantization functional device according to claim 1, wherein a resonance tunnel diode is fabricated.

16. A method for fabricating a quantization functional apparatus, comprising the steps of:

forming a plurality of quantization functional devices; and forming an electrode which operatively couples the plurality of the quantization functional devices to each other in series, wherein the step of forming the plurality of the quantization functional devices uses the method according to claim 1.

17. A method for fabricating a quantization functional apparatus, comprising the steps of:

forming a quantization functional device; and forming a resistive load operatively coupled to the quantization functional device in series, wherein the step of forming the quantization functional device uses the method according to claim 1.

18. A method for fabricating a quantization functional apparatus, comprising the steps of:

forming a quantization functional device on a substrate;

forming a MOS-type transistor on the substrate; and operatively coupling the quantization functional devices to the MOS-type transistor, wherein the step of forming the quantization functional devices uses the method according to claim 1.

19. A method for fabricating a quantization functional apparatus according to claim 16, wherein a memory is fabricated.

20. A method for fabricating a quantization functional apparatus according to claim 17, wherein a memory is fabricated.

21. A method for fabricating a quantization functional apparatus according to claim 18, wherein a memory is fabricated.

* * * * *